United States Patent
Watanabe et al.

(10) Patent No.: US 11,119,162 B2
(45) Date of Patent: *Sep. 14, 2021

(54) ANGLE SENSOR AND ANGLE SENSOR SYSTEM

(71) Applicant: TDK CORPORATION, Tokyo (JP)

(72) Inventors: Kazuya Watanabe, Tokyo (JP); Keisuke Uchida, Tokyo (JP); Hiraku Hirabayashi, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/901,580

(22) Filed: Jun. 15, 2020

(65) Prior Publication Data
US 2020/0309871 A1 Oct. 1, 2020

Related U.S. Application Data

(63) Continuation of application No. 15/675,940, filed on Aug. 14, 2017, now Pat. No. 10,712,404.

(30) Foreign Application Priority Data

Sep. 30, 2016 (JP) .................. 2016-194700

(51) Int. Cl.
*G01R 33/09* (2006.01)
*B60L 3/00* (2019.01)
(Continued)

(52) U.S. Cl.
CPC .......... *G01R 33/093* (2013.01); *B60L 3/0038* (2013.01); *G01C 15/04* (2013.01);
(Continued)

(58) Field of Classification Search
CPC ... G01R 33/093; G01R 33/098; B60L 3/0038; G01C 15/04; G01D 5/145; G01D 5/24495; G01D 18/004; G01B 7/30
See application file for complete search history.

(56) References Cited

U.S. PATENT DOCUMENTS

10,006,789 B2 6/2018 Mochizuki et al.
2009/0058407 A1* 3/2009 Kanekawa ............... G01D 5/14
324/228
(Continued)

FOREIGN PATENT DOCUMENTS

JP H05-346329 A 12/1993

OTHER PUBLICATIONS

Shang-Teh Wu et al., A Rotary Encoder With an Eccentrically Mounted Ring Magnet, 2014, IEEE Transactions on Instrumentation and Measurement, vol. 63, No. 8, pp. 1907-1915 (Year: 2014).*
(Continued)

*Primary Examiner* — Mischita L Henson
(74) *Attorney, Agent, or Firm* — Oliff PLC

(57) ABSTRACT

An angle sensor includes first and second detection units and an angle detection unit. Each of the first and second detection units generates two detection signals. The first and second detection units are arranged in a positional relationship that establishes predetermined phase relationships among the detection signals they generate. The angle detection unit includes first and second computing circuits and an angle computing unit. The first and second computing circuits generate first and second signals in each of which an error component corresponding to a fifth harmonic contained in the detection signals is reduced. The angle computing unit calculates a detected angle value on the basis of the first and second signals. The angle computing unit performs correction processing for reducing an error occurring in the detected angle value due to an error component corresponding to a third harmonic contained in the detection signals.

18 Claims, 14 Drawing Sheets

(51) Int. Cl.
  *G01C 15/04* (2006.01)
  *G01D 5/14* (2006.01)
  *G01D 5/244* (2006.01)
  *G01D 18/00* (2006.01)

(52) U.S. Cl.
  CPC ......... *G01D 5/145* (2013.01); *G01D 5/24495* (2013.01); *G01D 18/004* (2013.01); *G01R 33/098* (2013.01)

(56) References Cited

U.S. PATENT DOCUMENTS

| | | |
|---|---|---|
| 2012/0053865 A1 | 3/2012 | Saruki et al. |
| 2012/0256619 A1 | 10/2012 | Muto et al. |
| 2013/0221955 A1* | 8/2013 | Gatesoupe ......... G01D 5/24461 324/207.25 |
| 2014/0035493 A1* | 2/2014 | Ajima .................... H02P 21/18 318/400.04 |
| 2015/0204696 A1* | 7/2015 | Hirota ...................... G01D 5/16 324/207.21 |
| 2017/0343384 A1* | 11/2017 | Nakazato ............... G01D 5/244 |
| 2017/0370747 A1 | 12/2017 | Uchida et al. |

OTHER PUBLICATIONS

Udo Ausserlechner, Inaccuracies of Giant Magneto-Resistive Angle Sensors Due to Assembly Tolerances, May 2009, IEEE Transactions on Magnetics, vol. 45, No. 5, pp. 2165-2174.

Decision to Grant a Patent on Japenses Patent Application No. 2016-194700, dated May 9, 2018, 99. 1-2.

C.S. Anoop et al., Electronic Scheme for Computing Inverse-Cosine and its Application to a GMR Based Angle Sensor, Jul. 2012, IEEE Transactions on Instrumentation and Measurement, vol. 61, No. 7, pp. 1991-1999.

* cited by examiner

ANGLE SENSOR AND ANGLE SENSOR SYSTEM

CROSS REFERENCE TO RELATED APPLICATION

This application is a continuation of U.S. application Ser. No. 15/675,940, filed Aug. 14, 2017, the contents of which are incorporated herein by reference.

BACKGROUND OF THE INVENTION

1. Field of the Invention

The present invention relates to an angle sensor and an angle sensor system for generating a detected angle value having a correspondence with an angle that the direction of a rotating magnetic field forms with respect to a reference direction.

2. Description of the Related Art

In recent years, angle sensors have been widely used in various applications, such as detection of the rotational position of a steering wheel or a power steering motor in an automobile. The angle sensors generate a detected angle value having a correspondence with an angle to be detected. Examples of the angle sensors include a magnetic angle sensor. An angle sensor system using a magnetic angle sensor is typically provided with a magnetic field generation unit for generating a rotating magnetic field whose direction rotates in response to the rotation or linear movement of an object. The magnetic field generation unit is a magnet, for example. The angle to be detected by the magnetic angle sensor has a correspondence with an angle that the direction of the rotating magnetic field in a reference position forms with respect to a reference direction.

Among known magnetic angle sensors is one that includes a plurality of detection circuits for generating a plurality of detection signals of different phases and generates a detected angle value by performing an operation using the plurality of detection signals, as disclosed in US 2012/0053865 A1. Each of the plurality of detection circuits includes at least one magnetic detection element. The magnetic detection element includes, for example, a spin-valve magnetoresistance element including a magnetization pinned layer whose magnetization direction is pinned, a free layer whose magnetization direction varies depending on the direction of the rotating magnetic field, and a nonmagnetic layer located between the magnetization pinned layer and the free layer.

For the magnetic angle sensors, ideally, the plurality of detection signals each have a waveform of a sinusoidal curve (including a sine waveform and a cosine waveform) when the direction of the rotating magnetic field varies with a predetermined period. However, there are cases where the waveform of each detection signal is distorted from a sinusoidal curve. A distortion of the waveform of each detection signal may result in some error in the detected angle value. The error occurring in the detected angle value will hereinafter be referred to as angular error.

When each detection signal is distorted in waveform, each detection signal contains an ideal component and one or more error components. The ideal component varies in such a manner as to trace an ideal sinusoidal curve. The one or more error components correspond to one or more harmonics of the ideal component. When each detection signal is composed only of the ideal component, the detected angle value determined by calculation corresponds to a true angle to be detected by the angle sensor.

The detected angle value determined by calculation when each detection signal is composed only of the ideal component will hereinafter be referred to as ideal angle. The angular error is the difference between the ideal angle and the detected angle value.

The causes of distortion of the waveform of each detection signal are broadly classified into a first cause related to the rotating magnetic field generated by the magnetic field generation unit and a second cause related to the magnetic detection element. In the case of an ideal angle sensor system, when the angle to be detected varies with a predetermined period, a waveform that indicates the strength of a component of the rotating magnetic field in one direction in the position of each detection circuit, which will hereinafter be referred to as a field-strength waveform, is sinusoidal, and the waveform of each detection signal generated by each detection circuit is also sinusoidal. When the waveform of each detection signal is distorted due to the first cause, the field-strength waveform is distorted from a sinusoidal curve even when the angle to be detected varies with a predetermined period. When a distortion of the waveform of each detection signal is caused by the second cause, the waveform of each detection signal is distorted from a sinusoidal curve even when the field-strength waveform is sinusoidal. A distortion of the waveform of each detection signal may also be caused by the combination of the first cause and the second cause.

US 2012/0053865 A1 describes a technique to reduce an angular error resulting from an error component corresponding to a third harmonic of the ideal component by performing an operation using at least four detection signals.

JP H05-346329A describes a technique to remove one or more harmonics from a read signal in a magnetic sensor formed of a magnetoresistance element that is relatively movable along the calibration direction of a magnetic scale. In the magnetic sensor, a plurality of linear magnetoresistance element pieces provided at mutually different positions along the calibration direction are connected in series to constitute the magnetoresistance element so as to achieve the removal of the one or more harmonics from the read signal.

For the magnetic angle sensors, the one or more error components contained in each detection signal correspond mainly to one or more third or higher-order harmonics, particularly third or higher odd-order harmonics. Further, in the magnetic angle sensors, each detection signal may contain two error components corresponding to two harmonics of different orders.

As a method for reducing an angular error when each detection signal contains two error components, it is conceivable to correct each detection signal by signal processing so as to reduce the two error components contained in each detection signal. However, such a method requires complicated signal processing.

As a method for reducing an angular error when each detection signal contains two error components, it is also conceivable to generate two signals in which the two error components are reduced by operations using a plurality of detection signals, as disclosed in US 2012/0053865 A1. However, the method requires a large number of detection circuits and thus makes the angle sensor complicated in configuration.

The technique described in JP H05-346329A requires designing of the magnetoresistance element with the positions of the plurality of linear magnetoresistance element pieces varied in accordance with intervals of the calibration of the magnetic scale, thus causing difficulty in the design of the magnetoresistance element.

SUMMARY OF THE INVENTION

It is an object of the present invention to provide an angle sensor and an angle sensor system capable of easily reducing an angular error resulting from two error components contained in each of a plurality of detection signals.

An angle sensor of the present invention is configured to generate a detected angle value having a correspondence with an angle that the direction of a rotating magnetic field in a reference position forms with respect to a reference direction. An angle sensor system of the present invention includes the angle sensor of the present invention and a magnetic field generation unit for generating a rotating magnetic field.

The angle sensor of the present invention includes a first detection unit, a second detection unit, and an angle detection unit. The first detection unit includes a first detection signal generation unit and a second detection signal generation unit for generating a first detection signal and a second detection signal, respectively. Each of the first and second detection signals has a correspondence with an angle that the direction of the rotating magnetic field in a first position forms with respect to a first direction. The second detection unit includes a third detection signal generation unit and a fourth detection signal generation unit for generating a third detection signal and a fourth detection signal, respectively. Each of the third and fourth detection signals has a correspondence with an angle that the direction of the rotating magnetic field in a second position forms with respect to a second direction.

When the direction of the rotating magnetic field varies with a predetermined period, each of the first to fourth detection signals contains an ideal component, a first error component, and a second error component. The ideal component varies periodically in such a manner as to trace an ideal sinusoidal curve. The first error component is an error component corresponding to an n-th harmonic of the ideal component, and the second error component is an error component corresponding to an m-th harmonic of the ideal component, where n is greater than m. The ideal components of the first and second detection signals are different in phase from each other. The ideal components of the third and fourth detection signals are different in phase from each other.

The first detection unit and the second detection unit are arranged in a positional relationship that establishes a first phase relationship between the ideal components of the first and third detection signals, and a second phase relationship between the ideal components of the second and fourth detection signals. The first phase relationship is such a relationship that performing a first operation to obtain the sum of or difference between the first and third detection signals yields a first signal that is lower in the first error component than the first and third detection signals. The second phase relationship is such a relationship that performing a second operation to obtain the sum of or difference between the second and fourth detection signals yields a second signal that is lower in the first error component than the second and fourth detection signals.

The angle detection unit includes a first computing circuit for generating the first signal by performing the first operation, a second computing circuit for generating the second signal by performing the second operation, and an angle computing unit for calculating the detected angle value on the basis of the first signal and the second signal. The angle computing unit performs correction processing by which an error occurring in the detected angle value due to the second error component is reduced relative to the case where the correction processing is not performed.

The positional relationship between the first detection unit and the second detection unit may be such a relationship that the first position and the second position are different from each other so that the direction of the rotating magnetic field in the first position and the direction of the rotating magnetic field in the second position are different from each other.

When the positional relationship between the first detection unit and the second detection unit is such a relationship that the first position and the second position are different from each other as described above, the magnetic field generation unit of the angle sensor system may be configured to vary its relative position with respect to the first and second detection units in a predetermined direction, and the first position and the second position may be different from each other in the predetermined direction. The magnetic field generation unit may be configured to rotate about a central axis. In such a case, the aforementioned predetermined direction is the direction of rotation of the magnetic field generation unit. Further, in such a case, the first position and the second position may be in an imaginary plane perpendicular to the central axis and located at the same distance from the central axis. Alternatively, the first position and the second position may be on an imaginary straight line and different from each other. In such a case, the aforementioned predetermined direction is parallel to the imaginary straight line.

The positional relationship between the first detection unit and the second detection unit may be such a relationship that the first direction and the second direction are different from each other while the direction of the rotating magnetic field in the first position and the direction of the rotating magnetic field in the second position are the same.

In the angle sensor of the present invention, the first phase relationship may be a relationship in which the ideal components of the first and third detection signals have a phase difference of 180°/n, and the second phase relationship may be a relationship in which the ideal components of the second and fourth detection signals have a phase difference of 180°/n. In such a case, the first operation may be an operation to obtain the sum of the first and third detection signals, and the second operation may be an operation to obtain the sum of the second and fourth detection signals.

In the angle sensor of the present invention, the first phase relationship may be a relationship in which the ideal components of the first and third detection signals have a phase difference of 360°/n, and the second phase relationship may be a relationship in which the ideal components of the second and fourth detection signals have a phase difference of 360°/n. In such a case, the first operation may be an operation to obtain the difference between the first and third detection signals, and the second operation may be an operation to obtain the difference between the second and fourth detection signals.

The phase difference between the ideal components of the first and second detection signals and the phase difference between the ideal components of the third and fourth detection signals may both be 90°.

Each of the first to fourth detection signal generation units may include at least one magnetic detection element. The at least one magnetic detection element may include at least one magnetoresistance element. The at least one magnetoresistance element may include a magnetization pinned layer whose magnetization direction is pinned, a free layer whose magnetization direction varies depending on the direction of the rotating magnetic field, and a nonmagnetic layer located between the magnetization pinned layer and the free layer.

In the angle sensor of the present invention, m may be 3 and n may be 5.

In the angle sensor of the present invention, the correction processing may be processing for subtracting, from each of the first and second signals, an estimated value of the second error component contained therein.

In the angle sensor of the present invention, m may be 3. When the direction of the rotating magnetic field varies with the predetermined period, the error occurring in the detected angle value due to the second error component may contain a component that varies with a period of ½ the predetermined period. In such a case, the correction processing may include performing conversion operations to convert the first and second signals into first and second computation signals to be used for angle computation for calculating the detected angle value. The conversion operations convert the first and second signals into the first and second computation signals so that the component that varies with a period of ½ the predetermined period is reduced relative to the case where the detected angle value is calculated by performing the angle computation using the first and second signals.

According to the angle sensor and the angle sensor system of the present invention, the first detection unit and the second detection unit are arranged in a predetermined positional relationship, and the first and second computing circuits perform the first and second operations, which are relatively simple operations, thereby generating the first and second signals in each of which the first error component is reduced. Further, the angle computing unit performs the correction processing to reduce the error occurring in the detected angle value due to the second error component. The present invention thus enables easy reduction of the angular error resulting from the two error components contained in each of the plurality of detection signals.

Other and further objects, features and advantages of the present invention will appear more fully from the following description.

DETAILED DESCRIPTION OF THE PREFERRED EMBODIMENTS

First Embodiment

Figure 1:
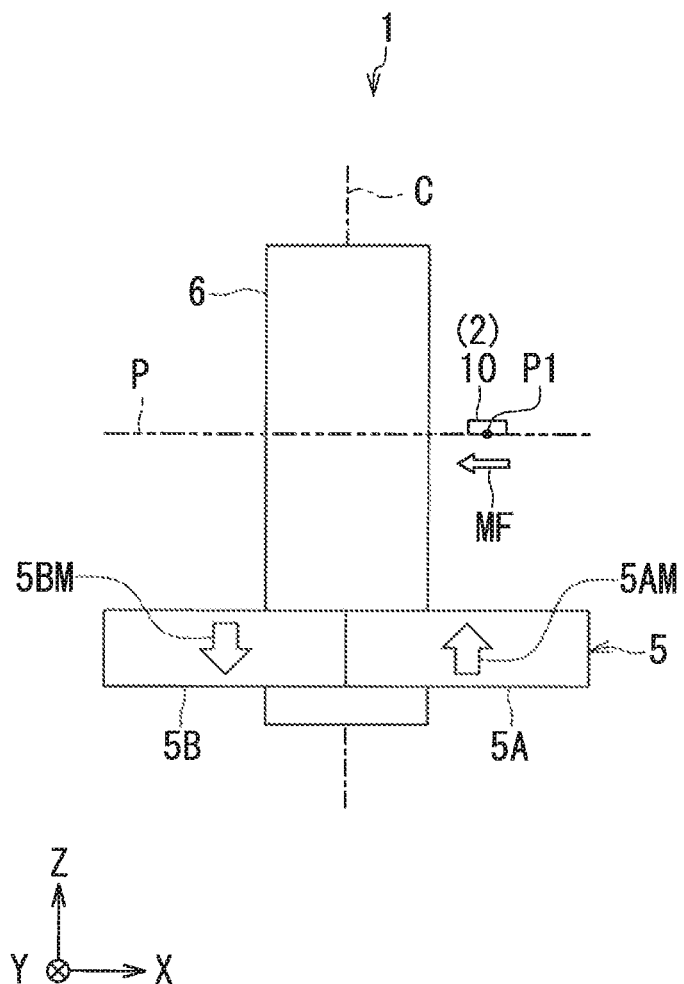
FIG. 1 is a side view illustrating the general configuration of an angle sensor system according to a first embodiment of the invention.
Figure 2:
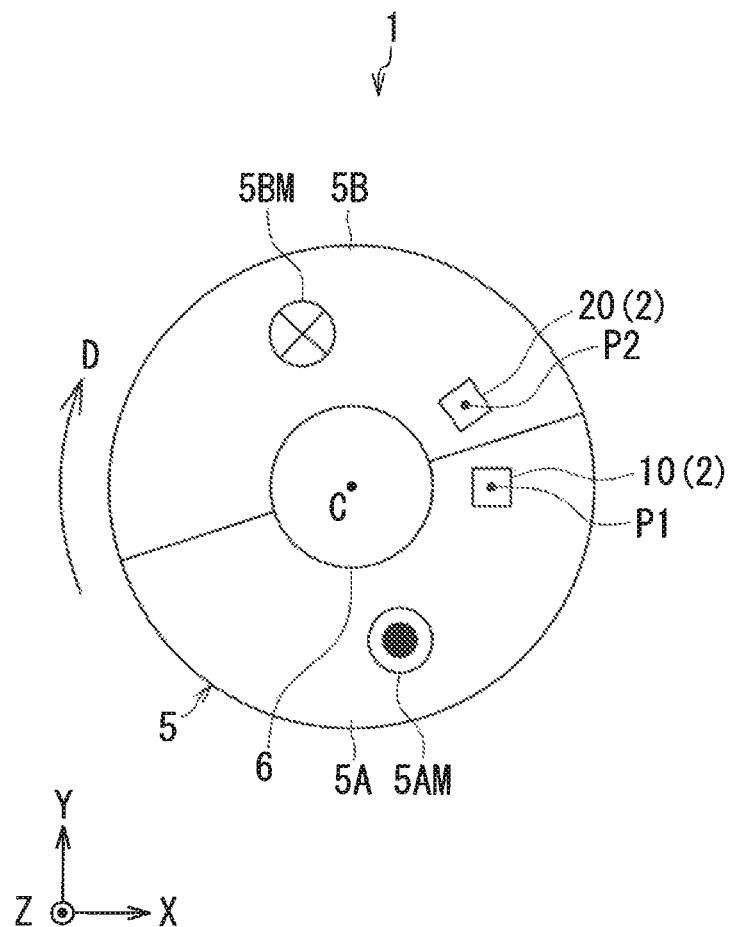
FIG. 2 is a plan view illustrating the general configuration of the angle sensor system according to the first embodiment of the invention.

Preferred embodiments of the present invention will now be described in detail with reference to the drawings. First, reference is made to FIG. 1 and FIG. 2 to describe the general configuration of an angle sensor system according to a first embodiment of the invention. The angle sensor system 1 according to the first embodiment includes an angle sensor 2 according to the first embodiment. The angle sensor 2 according to the first embodiment is a magnetic angle sensor, in particular. As shown in FIGS. 1 and 2, the angle sensor system 1 further includes a magnetic field generation unit 5 for generating a rotating magnetic field MF whose direction rotates. The angle sensor 2 is configured to generate a detected angle value having a correspondence with an angle that the direction of the rotating magnetic field MF in a reference position forms with respect to a reference direction. Hereinafter, the angle that the direction of the rotating magnetic field MF in a reference position forms with respect to a reference direction will be referred to as rotating field angle, and denoted by the symbol θM.

The magnetic field generation unit 5 of the present embodiment is a ring-shaped magnet mounted onto a rotary shaft 6, which is an object whose rotational position is to be detected. In response to the rotation of the rotary shaft 6, the magnetic field generation unit 5 rotates about a central axis C in a rotational direction D.

The magnetic field generation unit 5 includes a first portion 5A and a second portion 5B magnetized in mutually different directions. The first portion 5A and the second portion 5B are arranged symmetrically with respect to a first imaginary plane including the central axis C. In FIGS. 1 and 2, the symbol 5AM represents the magnetization direction of the first portion 5A, and the symbol 5BM represents the magnetization direction of the second portion 5B. The magnetization direction 5AM of the first portion 5A is parallel to the central axis C. The magnetization direction 5AM is upward in FIG. 1. The magnetization direction 5BM of the second portion 5B is opposite to the direction 5AM.

The reference position is located within a second imaginary plane parallel to an end face of the magnetic field generation unit 5 and perpendicular to the central axis C. The second imaginary plane will hereinafter be referred to as the reference plane P. In the reference plane P, the direction of the rotating magnetic field MF generated by the magnetic field generation unit 5 rotates about the reference position. The reference direction is located within the reference plane P and intersects the reference position.

In the following description, the direction of the rotating magnetic field MF in the reference position refers to a direction located within the reference plane P.

The angle sensor 2 includes a first detection unit 10 and a second detection unit 20. The first detection unit 10 and the second detection unit 20 are located to contact or intersect the reference plane P. The magnetic field generation unit 5 varies its relative position with respect to the first and second detection units 10 and 20 in the rotational direction D about the central axis C.

Figure 3:
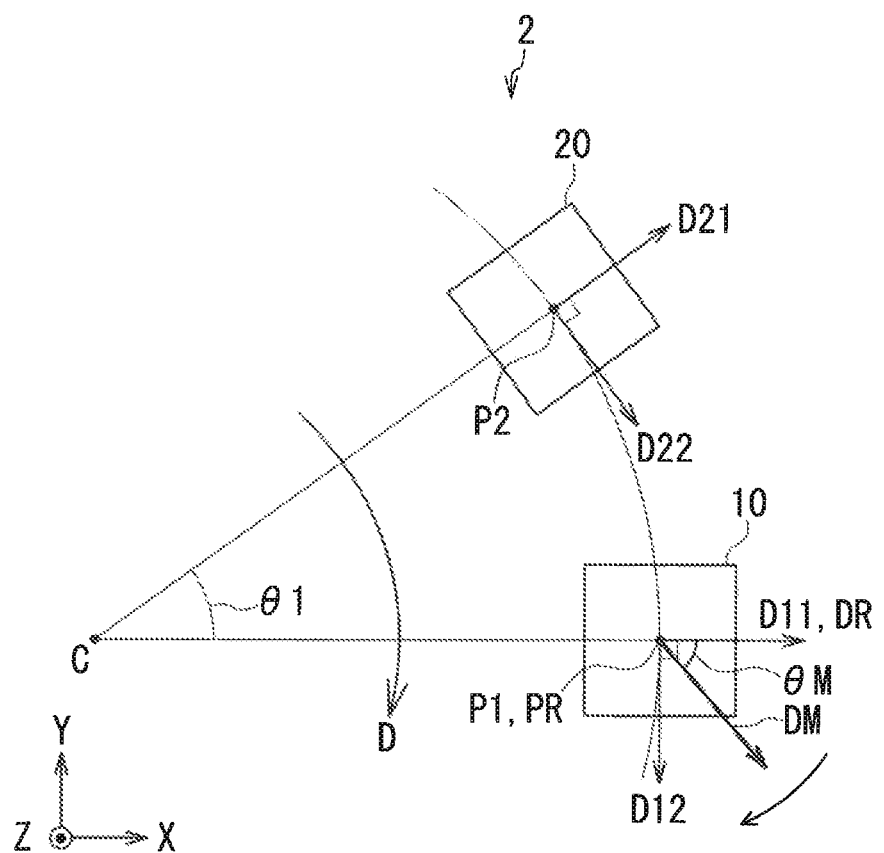
FIG. 3 is an explanatory diagram illustrating the definitions of directions and angles used in the first embodiment of the invention.

Now, the arrangement of the first and second detection units 10 and 20 and the definitions of directions and angles used in the present embodiment will be described with reference to FIGS. 1 to 3. First, Z direction is the direction parallel to the central axis C shown in FIG. 1 and upward in FIG. 1. In FIGS. 2 and 3, the Z direction is out of the plane of the drawing. Next, X and Y directions are two directions that are perpendicular to the Z direction and orthogonal to each other. In FIG. 1, the X direction is rightward, and the Y direction is into the plane of the drawing. In FIGS. 2 and 3, the X direction is rightward, and the Y direction is upward. Further, −X direction is the direction opposite to the X direction, and −Y direction is the direction opposite to the Y direction.

The first detection unit 10 detects the rotating magnetic field MF in a first position P1. The second detection unit 20 detects the rotating magnetic field MF in a second position P2. The first and second positions P1 and P2 are located in the first and second detection units 10 and 20, respectively. In the present embodiment, the first and second positions P1 and P2 are different from each other in the rotational direction D so that the direction of the rotating magnetic field MF in the first position P1 and the direction of the rotating magnetic field MF in the second portion P2 are different from each other.

As shown in FIG. 3, the first and second positions P1 and P2 are located within the reference plane P and at the same distance from the central axis C. The first and second positions P1 and P2 thus lie on the circumference of a circle about the central axis C located within the reference plane P. The reference plane P is also the XY plane including the first and second positions P1 and P2. In FIGS. 1 to 3, the X direction is from the central axis C to the first position P1.

The second position P2 is a position displaced counterclockwise from the first position P1 on the circumference by an angle θ1. The specific value of the angle θ1 will be described later.

The first and second detection units 10 and 20 are located in mutually different positions so that the first and second positions P1 and P2 have the above-described relationship with each other. The positional relationship between the first and second detection units 10 and 20 will be described in more detail later.

As shown in FIG. 3, the reference position will be denoted by the symbol PR, the reference direction will be denoted by the symbol DR, and the direction of the rotating magnetic field MF will be denoted by the symbol DM. In the present embodiment, the first position P1 is the reference position PR, and the X direction is the reference direction DR. Assume that the direction DM of the rotating magnetic field MF rotates clockwise in FIG. 3. The rotating field angle θM will be expressed in positive values when seen clockwise from the reference direction DR, and in negative values when seen counterclockwise from the reference direction DR.

A first direction D11, a second direction D21, a third direction D12, and a fourth direction D22 will be defined as shown in FIG. 3. The first to fourth directions D11, D21, D12 and D22 are all parallel to the reference plane P. The first direction D11 is from the central axis C to the first position P1. The first direction D11 is the same as the X direction and the reference direction DR. The second direction D21 is from the central axis C to the second position P2.

The third and fourth directions D12 and D22 are directions that are rotated by a predetermined angle from the first and second directions D11 and D21, respectively. In the present embodiment, the third and fourth directions D12 and D22 are directions that are rotated clockwise by 90° from the first and second directions D11 and D21, respectively.

Figure 4:
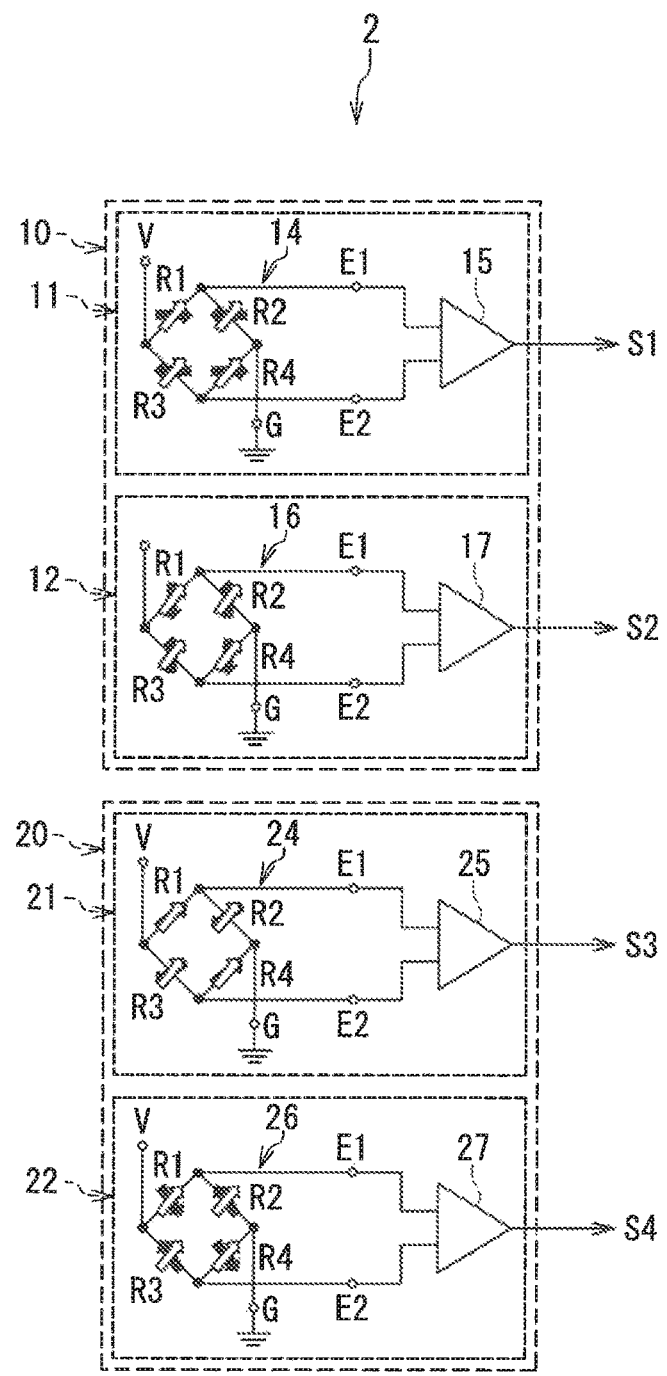
FIG. 4 is a circuit diagram illustrating the configuration of a first and a second detection unit of an angle sensor according to the first embodiment of the invention.
Figure 4:
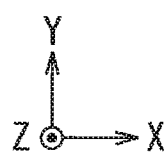

The configuration of the angle sensor 2 will now be described in detail with reference to FIG. 4. FIG. 4 is a circuit diagram illustrating the configuration of the angle sensor 2. The first detection unit 10 includes a first detection signal generation unit 11 and a second detection signal generation unit 12. The second detection unit 20 includes a third detection signal generation unit 21 and a fourth detection signal generation unit 22. Each of the first to fourth detection signal generation units 11, 12, 21 and 22 includes at least one magnetic detection element for detecting the rotating magnetic field MF. The at least one magnetic detection element may include at least one magnetoresistance element. The magnetoresistance element may be a giant magnetoresistance (GMR) element, a tunneling magnetoresistance (TMR) element, or an anisotropic magnetoresistance (AMR) element. The at least one magnetic detection element may further include at least one element for detecting a magnetic field other than the magnetoresistance element, such as a Hall element.

The first detection signal generation unit 11 generates a first detection signal S1. The second detection signal generation unit 12 generates a second detection signal S2. Each of the first and second detection signals S1 and S2 has a correspondence with the angle that the direction DM of the rotating magnetic field MF in the first position P1 forms with respect to the first direction D11.

The third detection signal generation unit 21 generates a third detection signal S3. The fourth detection signal generation unit 22 generates a fourth detection signal S4. Each of the third and fourth detection signals S3 and S4 has a correspondence with the angle that the direction DM of the rotating magnetic field MF in the second position P2 forms with respect to the second direction D21.

As the direction DM of the rotating magnetic field MF rotates with a predetermined period, all the first to fourth detection signals S1 to S4 vary periodically with a signal period equal to the predetermined period. The second and fourth detection signals S2 and S4 are different in phase from the first and third detection signals S1 and S3, respectively. In the present embodiment, the phases of the detection signals S2 and S4 are preferably different from the phases of the detection signals S1 and S3, respectively, by an odd number of times ¼ the signal period. However, in the light of the production accuracy of the magnetic detection element and other factors, the phase difference between the respective two detection signals can be slightly different from an odd number of times ¼ the signal period. The following description assumes that the phases of the detection signals satisfy the aforementioned preferred relationship.

FIG. 4 illustrates an example of the specific configuration of the first to fourth detection signal generation units 11, 12, 21 and 22. This example will be described in detail below.

The first detection signal generation unit 11 includes a Wheatstone bridge circuit 14 and a difference detector 15. The second detection signal generation unit 12 includes a Wheatstone bridge circuit 16 and a difference detector 17. The third detection signal generation unit 21 includes a Wheatstone bridge circuit 24 and a difference detector 25. The fourth detection signal generation unit 22 includes a Wheatstone bridge circuit 26 and a difference detector 27.

Each of the Wheatstone bridge circuits 14, 16, 24 and 26 includes a power supply port V, a ground port G, two output ports E1 and E2, a first pair of serially connected magnetic detection elements R1 and R2, and a second pair of serially connected magnetic detection elements R3 and R4. One end of each of the magnetic detection elements R1 and R3 is connected to the power supply port V. The other end of the magnetic detection element R1 is connected to one end of the magnetic detection element R2 and the output port E1. The other end of the magnetic detection element R3 is connected to one end of the magnetic detection element R4 and the output port E2. The other end of each of the magnetic detection elements R2 and R4 is connected to the ground port G. A power supply voltage of predetermined magnitude is applied to the power supply port V. The ground port G is grounded.

Each of the magnetic detection elements R1 to R4 includes a plurality of magnetoresistance (MR) elements connected in series. Each of the plurality of MR elements is a spin-valve MR element, for example. The spin-valve MR element includes a magnetization pinned layer whose magnetization direction is pinned, a free layer which is a magnetic layer whose magnetization direction varies depending on the direction DM of the rotating magnetic field MF, and a nonmagnetic layer located between the magnetization pinned layer and the free layer. The spin-valve MR element may be a TMR element or a GMR element. In the TMR element, the nonmagnetic layer is a tunnel barrier layer. In the GMR element, the nonmagnetic layer is a nonmagnetic conductive layer. The spin-valve MR element varies in resistance depending on the angle that the magnetization direction of the free layer forms with respect to the magnetization direction of the magnetization pinned layer, and has a minimum resistance when the foregoing angle is 0° and a maximum resistance when the foregoing angle is 180°. In FIG. 4, the filled arrows indicate the magnetization directions of the magnetization pinned layers of the MR elements, and the hollow arrows indicate the magnetization directions of the free layers of the MR elements.

In the first detection signal generation unit 11, the magnetization pinned layers of the MR elements included in the magnetic detection elements R1 and R4 are magnetized in the first direction D11, and the magnetization pinned layers of the MR elements included in the magnetic detection elements R2 and R3 are magnetized in the opposite direction to the first direction D11. In this case, the potential difference between the output ports E1 and E2 of the Wheatstone bridge circuit 14 varies depending on the strength of a component in the first direction D11 of the rotating magnetic field MF in the first position P1. The difference detector 15 outputs a signal corresponding to the potential difference between the output ports E1 and E2 of the Wheatstone bridge circuit 14 as the first detection signal S1. The first detection signal generation unit 11 thus detects the strength of the component in the first direction D11 of the rotating magnetic field MF in the first position P1 and generates the first detection signal S1 indicative of the strength. Each of this strength and the first detection signal S1 has a correspondence with the angle that the direction DM of the rotating magnetic field MF in the first position P1 forms with respect to the first direction D11.

In the second detection signal generation unit 12, the magnetization pinned layers of the MR elements included in the magnetic detection elements R1 and R4 are magnetized in the third direction D12, and the magnetization pinned layers of the MR elements included in the magnetic detection elements R2 and R3 are magnetized in the opposite direction to the third direction D12. In this case, the potential difference between the output ports E1 and E2 of the Wheatstone bridge circuit 16 varies depending on the strength of a component in the third direction D12 of the rotating magnetic field MF in the first position P1. The difference detector 17 outputs a signal corresponding to the potential difference between the output ports E1 and E2 of the Wheatstone bridge circuit 16 as the second detection signal S2. The second detection signal generation unit 12 thus detects the strength of the component in the third direction D12 of the rotating magnetic field MF in the first position P1 and generates the second detection signal S2 indicative of the strength. Each of this strength and the second detection signal S2 has a correspondence with the angle that the direction DM of the rotating magnetic field MF in the first position P1 forms with respect to the first direction D11.

In the third detection signal generation unit 21, the magnetization pinned layers of the MR elements included in the magnetic detection elements R1 and R4 are magnetized in the second direction D21, and the magnetization pinned layers of the MR elements included in the magnetic detection elements R2 and R3 are magnetized in the opposite direction to the second direction D21. In this case, the potential difference between the output ports E1 and E2 of the Wheatstone bridge circuit 24 varies depending on the strength of a component in the second direction D21 of the rotating magnetic field MF in the second position P2. The difference detector 25 outputs a signal corresponding to the potential difference between the output ports E1 and E2 of the Wheatstone bridge circuit 24 as the third detection signal S3. The third detection signal generation unit 21 thus detects the strength of the component in the second direction D21 of the rotating magnetic field MF in the second position P2 and generates the third detection signal S3 indicative of the strength. Each of this strength and the third detection signal S3 has a correspondence with the angle that the direction DM of the rotating magnetic field MF in the second position P2 forms with respect to the second direction D21.

In the fourth detection signal generation unit 22, the magnetization pinned layers of the MR elements included in the magnetic detection elements R1 and R4 are magnetized in the fourth direction D22, and the magnetization pinned layers of the MR elements included in the magnetic detection elements R2 and R3 are magnetized in the opposite direction to the fourth direction D22. In this case, the potential difference between the output ports E1 and E2 of the Wheatstone bridge circuit 26 varies depending on the strength of a component in the fourth direction D22 of the rotating magnetic field MF in the second position P2. The difference detector 27 outputs a signal corresponding to the potential difference between the output ports E1 and E2 of the Wheatstone bridge circuit 26 as the fourth detection signal S4. The fourth detection signal generation unit 22 thus detects the strength of the component in the fourth direction D22 of the rotating magnetic field MF in the second position P2 and generates the fourth detection signal S4 indicative of the strength. Each of this strength and the fourth detection signal S4 has a correspondence with the angle that the direction DM of the rotating magnetic field MF in the second position P2 forms with respect to the second direction D21.

The first and second detection units 10 and 20 may be constructed of two discrete components. The two discrete components may have the same mechanical structure, and be configured so that the magnetizations of the plurality of magnetization pinned layers are in the same relative direction with respect to the mechanical structure. In such a case, the magnetization directions of the magnetization pinned layers of the above-described MR elements can be easily defined by adjusting the layout and the orientations of the two discrete components.

In the light of the production accuracy of the MR elements and other factors, the magnetization directions of the magnetization pinned layers of the plurality of MR elements in the detection signal generation units 11, 12, 21 and 22 may be slightly different from the above-described directions.

Figure 6:
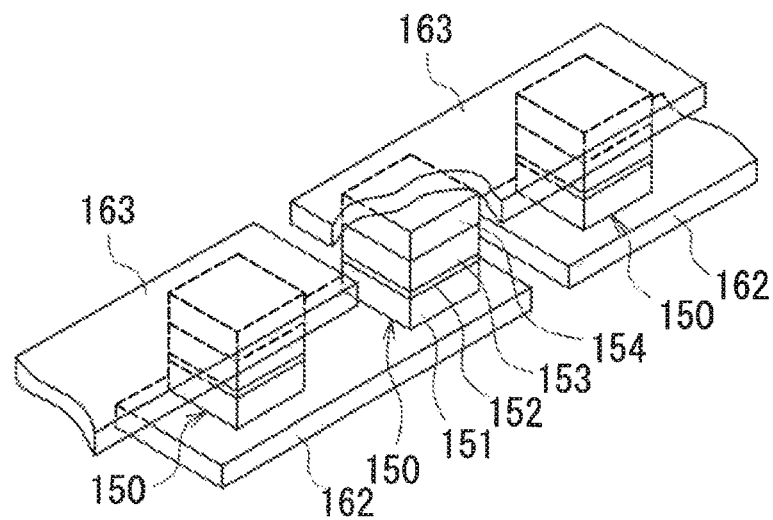
FIG. 6 is a perspective view of a portion of a magnetic detection element shown in FIG. 4.

An example of the configuration of the magnetic detection elements will now be described with reference to FIG. 6. FIG. 6 is a perspective view illustrating a portion of a magnetic detection element in the angle sensor 2 shown in FIG. 4. In this example, the magnetic detection element includes a plurality of lower electrodes 162, a plurality of MR elements 150 and a plurality of upper electrodes 163. The plurality of lower electrodes 162 are arranged on a substrate (not illustrated). Each of the lower electrodes 162 has a long slender shape. Every two lower electrodes 162 that are adjacent to each other in the longitudinal direction of the lower electrodes 162 have a gap therebetween. As shown in FIG. 6, MR elements 150 are provided on the top surfaces of the lower electrodes 162, near opposite ends in the longitudinal direction. Each of the MR elements 150 includes a free layer 151, a nonmagnetic layer 152, a magnetization pinned layer 153, and an antiferromagnetic layer 154 which are stacked in this order, the free layer 151 being closest to the lower electrode 162. The free layer 151 is electrically connected to the lower electrode 162. The antiferromagnetic layer 154 is formed of an antiferromagnetic material. The antiferromagnetic layer 154 is in exchange coupling with the magnetization pinned layer 153 so as to pin the magnetization direction of the magnetization pinned layer 153. The plurality of upper electrodes 163 are arranged over the plurality of MR elements 150. Each of the upper electrodes 163 has a long slender shape, and establishes electrical connection between the respective antiferromagnetic layers 154 of two adjacent MR elements 150 that are arranged on two lower electrodes 162 adjacent in the longitudinal direction of the lower electrodes 162. With such a configuration, the plurality of MR elements 150 in the magnetic detection element shown in FIG. 6 are connected in series by the plurality of lower electrodes 162 and the plurality of upper electrodes 163. It should be appreciated that the layers 151 to 154 of the MR elements 150 may be stacked in the reverse order to that shown in FIG. 6.

As mentioned previously, as the direction DM of the rotating magnetic field MF rotates with a predetermined period, all the first to fourth detection signals S1 to S4 vary periodically with a signal period equal to the predetermined period. Ideally, the first to fourth detection signals S1 to S4 each have a waveform of a sinusoidal curve (including a sine waveform and a cosine waveform). In actuality, however, there are cases where the waveforms of the first to fourth detection signals S1 to S4 are distorted from a sinusoidal curve. The causes of distortion of the waveforms of the first to fourth detection signals S1 to S4 are broadly classified into the following two: a first cause related to the rotating magnetic field MF generated by the magnetic field generation unit 5; and a second cause related to the magnetic detection elements.

The distortion of the waveforms of the first to fourth detection signals S1 to S4 means that the first to fourth detection signals S1 to S4 each contain an ideal component which varies periodically in such a manner as to trace an ideal sinusoidal curve, and error components other than the ideal component. In such a case, some error may occur in the detected angle value. The error occurring in the detected angle value will hereinafter be referred to as angular error. A detected angle value determined by calculation when each of the first to fourth detection signals S1 to S4 is composed only of the ideal component corresponds to the true angle to be detected by the angle sensor 2. The detected angle value determined by calculation when each of the first to fourth detection signals S1 to S4 is composed only of the ideal component will hereinafter be referred to as ideal angle. The angular error is the difference between the ideal angle and the detected angle value. When the waveforms of the first to fourth detection signals S1 to S4 are distorted due to the first cause, the rotating field angle θM may differ from the ideal angle.

In the present embodiment, when the direction DM of the rotating magnetic field MF varies with a predetermined period, each of the first to fourth detection signals S1 to S4 contains the ideal component, a first error component, and a second error component. The first error component is an error component corresponding to an n-th harmonic of the ideal component, and the second error component is an error component corresponding to an m-th harmonic of the ideal component, where n is greater than m. In the present embodiment, in particular, m is 3 and n is 5.

Of angular errors, an error resulting from the first error component will be referred to as the first angular error component, and an error resulting from the second error component will be referred to as the second angular error component.

The ideal components of the first and second detection signals S1 and S2 are different in phase from each other. The ideal components of the third and fourth detection signals S3 and S4 are different in phase from each other. In the present embodiment, the phase difference between the ideal components of the first and second detection signals S1 and S2 and the phase difference between the ideal components of the third and fourth detection signals S3 and S4 are both 90°.

Figure 5:
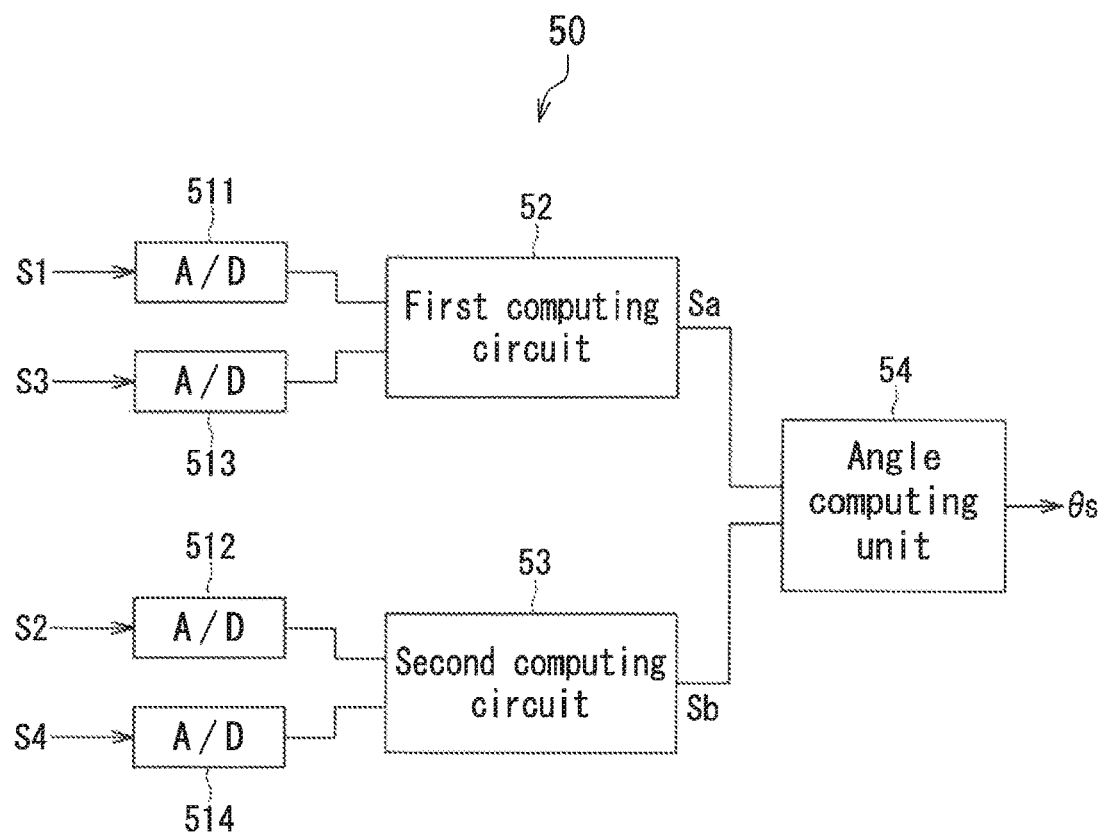
FIG. 5 is a functional block diagram illustrating the configuration of an angle detection unit of the angle sensor according to the first embodiment of the invention.

Now, parts of the angle sensor 2 other than the first and second detection units 10 and 20 will be described with reference to FIG. 5. The angle sensor 2 includes an angle detection unit 50 aside from the first and second detection units 10 and 20. The angle detection unit 50 generates a detected angle value θs having a correspondence with the rotating field angle θM. FIG. 5 is a functional block diagram illustrating the configuration of the angle detection unit 50. The angle detection unit 50 can be implemented by an application-specific integrated circuit (ASIC) or a microcomputer, for example.

The angle detection unit 50 includes a first computing circuit 52 for generating a first signal Sa, a second computing circuit 53 for generating a second signal Sb, and an angle computing unit 54 for calculating the detected angle value θs on the basis of the first and second signals Sa and Sb.

The angle detection unit 50 further includes analog-to-digital converters (hereinafter, "A/D converters") 511, 512, 513 and 514. The first computing circuit 52, the second computing circuit 53 and the angle computing unit 54 use digital signals. The A/D converters 511-514 respectively convert the first to fourth detection signals S1-S4 to digital signals. The first computing circuit 52 generates the first signal Sa by performing operations using the first and third detection signals S1 and S3, which have been converted to digital signals by the A/D converters 511 and 513, respectively. The second computing circuit 53 generates the second signal Sb by performing operations using the second and fourth detection signals S2 and S4, which have been converted to digital signals by the A/D converters 512 and 514, respectively. The method for generating the first and second signals Sa and Sb and the method for calculating the detected angle value θs will be described in detail later.

Now, the positional relationship between the first and second detection units 10 and 20 will be described in detail. The first and second detection units 10 and 20 are arranged in a positional relationship that establishes the following two phase relationships. Specifically, the positional relationship establishes a first phase relationship between the ideal components of the first and third detection signals S1 and S3, and a second phase relationship between the ideal components of the second and fourth detection signals S2 and S4.

The first phase relationship is such a relationship that performing a first operation to obtain the sum of or difference between the first and third detection signals S1 and S3 yields the first signal Sa that is lower in the first error component than the first and third detection signals S1 and S3.

The second phase relationship is such a relationship that performing a second operation to obtain the sum of or difference between the second and fourth detection signals S2 and S4 yields the second signal Sb that is lower in the first error component than the second and fourth detection signals S2 and S4.

A first example and a second example of the present embodiment will be described below. The first example will be described first. In the first example, the first phase relationship is a relationship in which the ideal components of the first and third detection signals S1 and S3 have a phase difference of 180°/n, and the second phase relationship is a relationship in which the ideal components of the second and fourth detection signals S2 and S4 have a phase difference of 180°/n. In such a case, the first operation is an operation to obtain the sum of the first and third detection signals S1 and S3, and the second operation is an operation to obtain the sum of the second and fourth detection signals S2 and S4. In the first example, the first and second detection units 10 and 20 are arranged to establish the first and second phase relationships described above. To be more specific, the first and second positions P1 and P2 are defined to make the angle θ1 of FIG. 3 have a magnitude equivalent to an electrical angle of 180°/n.

In the present embodiment, in particular, n is 5. Thus, 180°/n is 36°. One period of the first to fourth detection signals S1 to S4, i.e., an electrical angle of 360°, is equivalent to one rotation of the magnetic field generation unit 5, i.e., a rotational angle of 360° of the magnetic field generation unit 5. Thus, in the first example, the first and second detection units 10 and 20 are arranged by defining the first and second positions P1 and P2 to make the angle θ1 be 36°.

Now, the ideal component of the first detection signal S1 will be denoted by cos θ, and the ideal component of the second detection signal S2 will be denoted by sine. In this case, the first and second detection signals S1 and S2 are expressible by the following Eqs. (1) and (2), respectively. In Eq. (1), "$a_1 \cdot \cos(n\theta)$" represents the first error component of the first detection signal S1, and "$b_1 \cdot \cos(m\theta + g_1)$" represents the second error component of the first detection signal S1. In Eq. (2), "$a_2 \cdot \sin(n\theta)$" represents the first error component of the second detection signal S2, and "$b_2 \cdot \sin(m\theta + g_2)$" represents the second error component of the second detection signal S2. The values $g_1$ and $g_2$ are dependent on the phase difference between the ideal component and the second error component.

$$S1 = \cos\theta + a_1 \cdot \cos(n\theta) + b_1 \cdot \cos(m\theta + g_1) \tag{1}$$

$$S2 = \sin\theta + a_2 \cdot \sin(n\theta) + b_2 \cdot \sin(m\theta + g_2) \tag{2}$$

According to the first example, the third and fourth detection signals S3 and S4 are expressible by the following Eqs. (3) and (4), respectively.

$$\begin{aligned}
S3 &= \cos(\theta + 180°/n) \\
&\quad + a_1 \cdot \cos\{n(\theta + 180°/n)\} \\
&\quad + b_1 \cdot \cos\{m(\theta + 180°/n) + g_1\} \\
&= \cos(\theta + 180°/n) \\
&\quad + a_1 \cdot \cos(n\theta + 180°) \\
&\quad + b_1 \cdot \cos\{m(\theta + 180°/n) + g_1\} \\
&= \cos(\theta + 180°/n) \\
&\quad - a_1 \cdot \cos(n\theta) \\
&\quad + b_1 \cdot \cos\{m(\theta + 180°/n) + g_1\}
\end{aligned} \tag{3}$$

$$\begin{aligned}
S4 &= \sin(\theta + 180°/n) \\
&\quad + a_2 \cdot \sin\{n(\theta + 180°/n)\} \\
&\quad + b_2 \cdot \sin\{m(\theta + 180°/n) + g_2\} \\
&= \sin(\theta + 180°/n) \\
&\quad + a_2 \cdot \sin(n\theta + 180°) \\
&\quad + b_2 \cdot \sin\{m(\theta + 180°/n) + g_2\} \\
&= \sin(\theta + 180°/n) \\
&\quad - a_2 \cdot \sin(n\theta) \\
&\quad + b_2 \cdot \sin\{m(\theta + 180°/n) + g_2\}
\end{aligned} \tag{4}$$

As is understood from Eqs. (1) and (3), performing the first operation of the first example, that is, the operation to obtain the sum of the first and third detection signals S1 and S3, allows the first error component "$a_1 \cdot \cos(n\theta)$" in Eq. (1) and the first error component "$-a_1 \cdot \cos(n\theta)$" in Eq. (3) to cancel each other out to thereby yield the first signal Sa that is lower in the first error component than the first and third detection signals S1 and S3.

As is understood from Eqs. (2) and (4), performing the second operation of the first example, that is, the operation to obtain the sum of the second and fourth detection signals S2 and S4, allows the first error component "$a_2 \cdot \sin(n\theta)$" in Eq. (2) and the first error component "$-a_2 \cdot \sin(n\theta)$" in Eq. (4) to cancel each other out to thereby yield the second signal Sb that is lower in the first error component than the second and fourth detection signals S2 and S4.

The second example will now be described. In the second example, the first phase relationship is a relationship in which the ideal components of the first and third detection signals S1 and S3 have a phase difference of 360°/n, and the second phase relationship is a relationship in which the ideal components of the second and fourth detection signals S2 and S4 have a phase difference of 360°/n. In such a case, the first operation is an operation to obtain the difference between the first and third detection signals S1 and S3, and the second operation is an operation to obtain the difference between the second and fourth detection signals S2 and S4. In the second example, the first and second detection units 10 and 20 are arranged to establish the first and second phase relationships described above. To be more specific, the first and second positions P1 and P2 are defined to make the angle θ1 of FIG. 3 have a magnitude equivalent to an electrical angle of 360°/n.

In the present embodiment, in particular, 360°/n is 72°. According to the second example, the first and second detection units 10 and 20 are arranged by defining the first and second positions P1 and P2 to make the angle θ1 be 72°.

If the first and second detection signals S1 and S2 are expressed by Eqs. (1) and (2) as in the first example, then in the second example the third and fourth detection signals S3 and S4 are expressible by the following Eqs. (5) and (6), respectively.

$$S3 = \cos(\theta + 360°/n) \quad (5)$$
$$+ a_1 \cdot \cos\{n(\theta + 360°/n)\}$$
$$+ b_1 \cdot \cos\{m(\theta + 360°/n) + g_1\}$$
$$= \cos(\theta + 360°/n)$$
$$+ a_1 \cdot \cos(n\theta + 360°)$$
$$+ b_1 \cdot \cos\{m(\theta + 360°/n) + g_1\}$$
$$= \cos(\theta + 360°/n)$$
$$+ a_1 \cdot \cos(n\theta)$$
$$+ b_1 \cdot \cos\{m(\theta + 360°/n) + g_1\}$$

$$S4 = \sin(\theta + 360°/n) \quad (6)$$
$$+ a_2 \cdot \sin\{n(\theta + 360°/n)\}$$
$$+ b_2 \cdot \sin\{m(\theta + 360°/n) + g_2\}$$
$$= \sin(\theta + 360°/n)$$
$$+ a_2 \cdot \sin(n\theta + 360°)$$
$$+ b_2 \cdot \sin\{m(\theta + 360°/n) + g_2\}$$
$$= \sin(\theta + 360°/n)$$
$$+ a_2 \cdot \sin(n\theta)$$
$$+ b_2 \cdot \sin\{m(\theta + 360°/n) + g_2\}$$

As is understood from Eqs. (1) and (5), performing the first operation of the second example, that is, the operation to obtain the difference between the first and third detection signals S1 and S3, allows the first error component "$a_1 \cdot \cos(n\theta)$" in Eq. (1) and the first error component "$a_1 \cdot \cos(n\theta)$" in Eq. (5) to cancel each other out to thereby yield the first signal Sa that is lower in the first error component than the first and third detection signals S1 and S3.

As is understood from Eqs. (2) and (6), performing the second operation of the second example, that is, the operation to obtain the difference between the second and fourth detection signals S2 and S4, allows the first error component "$a_2 \cdot \sin(n\theta)$" in Eq. (2) and the first error component "$a_2 \cdot \sin(n\theta)$" in Eq. (6) to cancel each other out to thereby yield the second signal Sb that is lower in the first error component than the second and fourth detection signals S2 and S4.

According to the present embodiment, regardless of whether the first cause or the second cause distorts the waveform of each of the first to fourth detection signals S1 to S4, if the first and second detection signals S1 and S2 are expressed by Eqs. (1) and (2), respectively, then Eqs. (3) and (4) hold in the first example and Eqs. (5) and (6) hold in the second example.

Now, a method for generating the first and second signals Sa and Sb and a method for calculating the detected angle value θs will be described. First, a description will be given of the method for generating the first and second signals Sa and Sb and the method for calculating the detected angle value θs according to the foregoing first example. The first computing circuit 52 generates the first signal Sa by performing the first operation of the first example, i.e., the operation to obtain the sum of the first and third detection signals S1 and S3. To be more specific, for example, the first computing circuit 52 generates the first signal Sa using the following Eq. (7). Eq. (7) uses the first and third detection signals S1 and S3 expressed by Eqs. (1) and (3), respectively. In the following description, $\alpha_1 = 180°/n$.

$$Sa = S1 + S3 \quad (7)$$
$$= \cos\theta + b_1 \cdot \cos(m\theta + g_1)$$
$$+ \cos(\theta + \alpha_1) + b_1 \cdot \cos\{m(\theta + \alpha_1) + g_1\}$$
$$= 2\cos(\theta + \alpha_1/2) \cdot \cos(-\alpha_1/2)$$
$$+ 2b_1 \cdot \cos\{m(\theta + \alpha_1/2) + g_1\} \cdot \cos(-m\alpha_1/2)$$
$$= 2\cos(\alpha_1/2) \cdot \cos(\theta + \alpha_1/2)$$
$$+ 2b_1 \cdot \cos(m\alpha_1/2) \cdot \cos\{m(\theta + \alpha_1/2) + g_1\}$$

The second computing circuit 53 generates the second signal Sb by performing the second operation of the first example, i.e., the operation to obtain the sum of the second and fourth detection signals S2 and S4. To be more specific, for example, the second computing circuit 53 generates the second signal Sb using the following Eq. (8). Eq. (8) uses the second and fourth detection signals S2 and S4 expressed by Eqs. (2) and (4), respectively.

$$Sb = S2 + S4 \quad (8)$$
$$= \sin\theta + b_2 \cdot \sin(m\theta + g_2)$$
$$+ \sin(\theta + \alpha_1) + b_2 \cdot \sin\{m(\theta + \alpha_1) + g_2\}$$
$$= 2\sin(\theta + \alpha_1/2) \cdot \cos(-\alpha_1/2)$$
$$+ 2b_2 \cdot \sin\{m(\theta + \alpha_1/2) + g_2\} \cdot \cos(-m\alpha_1/2)$$
$$= 2\cos(\alpha_1/2) \cdot \sin(\theta + \alpha_1/2)$$
$$+ 2b_2 \cdot \cos(m\alpha_1/2) \cdot \cos\{m(\theta + \alpha_1/2) + g_2\}$$

When $\beta_1=2\cos(\alpha_1/2)$, $\gamma_{11}=2b_1\cdot\cos(m\alpha_1/2)$, $\gamma_{12}=2b_2\cdot\cos(m\alpha_1/2)$, and $\phi_1=\theta+\alpha_1/2$, the first and second signals Sa and Sb are expressed by the following Eqs. (9) and (10), respectively.

$$Sa=\beta_1\cdot\cos\phi_1+\gamma_{11}\cdot\cos(m\phi_1+g_1) \quad (9)$$

$$Sb=\beta_1\cdot\sin\phi_1+\gamma_{12}\cdot\sin(m\phi_1+g_2) \quad (10)$$

In Eq. (9), "$\gamma_{11}\cdot\cos(m\phi_1+g_1)$" is the second error component contained in the first signal Sa. In Eq. (10), "$\gamma_{12}\cdot\sin(m\phi_1+g_2)$" is the second error component contained in the second signal Sb.

Figure 7:
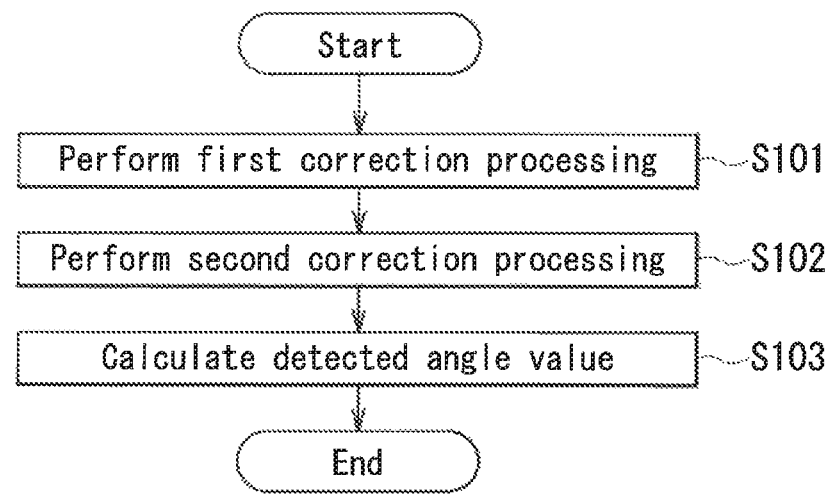
FIG. 7 is a flowchart of processing to be performed by an angle computing unit shown in FIG. 5.

Processing to be performed by the angle computing unit 54 will now be described. FIG. 7 is a flowchart of the processing to be performed by the angle computing unit 54. As shown in FIG. 7, the processing to be performed by the angle computing unit 54 includes step S101 of performing first correction processing, step S102 of performing second correction processing, and step S103 of calculating the detected angle value θs. Steps S101, S102 and S103 are performed in this order. The first correction processing and the second correction processing include conversion operations to convert the first and second signals Sa and Sb into first and second computation signals to be used for angle computation to calculate the detected angle value θs. Steps S101, S102 and S103 will be described one by one below.

Step S101 will be described first. The first correction processing to be performed in step S101 is processing by which the error occurring in the detected angle value θs due to the second error component, that is, the second angular error component, is reduced relative to the case where the first correction processing is not performed. The first correction processing generates a signal Sa1 that is lower in the second error component than the first signal Sa, and a signal Sb1 that is lower in the second error component than the second signal Sb. To be more specific, the signal Sa1 is generated by, for example, subtracting an estimated value of the second error component of the first signal Sa from the first signal Sa, and the signal Sb1 is generated by, for example, subtracting an estimated value of the second error component of the second signal Sb from the second signal Sb. In this case, the signals Sa1 and Sb1 are expressed by the following Eqs. (11) and (12), respectively.

$$Sa1=Sa-F_{11}\cdot\cos(m\phi p_1+G_1) \quad (11)$$

$$Sb1=Sb-F_{12}\cdot\sin(m\phi p_1+G_2) \quad (12)$$

In Eq. (11), "$F_{11}\cdot\cos(m\phi p_1+G_1)$" is the estimated value of the second error component of the first signal Sa. In Eq. (12), "$F_{12}\cdot\sin(m\phi p_1+G_2)$" is the estimated value of the second error component of the second signal Sb. $F_{11}$, $F_{12}$, $G_1$, and $G_2$ are values corresponding to $\gamma_{11}$, $\gamma_{12}$, $g_1$, and $g_2$, respectively. The values $F_{11}$, $F_{12}$, $G_1$, and $G_2$ can be determined on the basis of the results of applying a Fourier transform to the waveform of each of the first and second signals Sa and Sb. Further, $\phi_1$ is calculated by the following Eq. (13) using the first and second signals Sa and Sb. In Eq. (13), "a tan" represents arctangent.

$$\phi p_1=a\tan(Sb/Sa) \quad (13)$$

For $\phi p_1$ within the range of 0° to less than 360°, Eq. (13) yields two solutions that are 180° different in value. Which of the two solutions for $\phi p_1$ in Eq. (13) is the true value of $\phi p_1$ can be determined from the combination of positive and negative signs of Sa and Sb. The angle computing unit 54 determines $\phi p_1$ within the range of 0° to less than 360° using Eq. (13) and the foregoing determination on the combination of positive and negative signs of Sa and Sb.

Next, step S102 will be described. Ideally, the center of variation of each of the signals Sa1 and Sb1 should be 0 and the signals Sa1 and Sb1 should have equal amplitudes and a phase difference of 90°. In actuality, however, the signals Sa1 and Sb1 may each have an offset, may have different amplitudes from each other, or may have a phase difference other than 90°. The second correction processing to be performed in step S102 is basically processing for correcting the offset and the amplitude of each of the signals Sa1 and Sb1 to cause the signals Sa1 and Sb1 to have a phase difference of 90°. This enables reduction of a component of angular error that is caused by the offset, the difference in amplitude, or a phase difference other than 90°.

When the direction DM of the rotating magnetic field MF varies with a predetermined period, the angular error may contain a component that varies with a period of ½ the predetermined period, even if the first correction processing and the above-described fundamental corrections are performed. The component of the angular error that varies with a period of ½ the predetermined period will hereinafter be referred to as the second-order angular error component. The second correction processing reduces the second-order angular error component by using correction parameters to be described later. The second-order angular error component includes a component that is caused by the second error component, in other words, a component that can also be referred to as the second angular error component, and a component that is caused by a cause other than the second error component. In the present embodiment, since the first correction processing reduces the second angular error component, the second correction processing mainly reduces the component of the second-order angular error component that is caused by a cause other than the second error component.

The second correction processing will be concretely described below. The angle computing unit 54 first generates signals Sa2 and Sb2 corresponding to the signals Sa1 and Sb1 by performing operations using functions for correcting the offset and amplitude. To be more specific, the angle computing unit 54 generates the signal Sa2 using the function expressed by the following Eq. (14), and generates the signal Sb2 using the function expressed by the following Eq. (15).

$$Sa2=(Sa1-Sa1_{off})/Sa1_{amp}/C1 \quad (14)$$

$$Sb2=(Sb1-Sb1_{off})/Sb1_{amp}\cdot C1 \quad (15)$$

In Eq. (14), $Sa1_{off}$ and $Sa1_{amp}$ represent the offset and the amplitude of the signal Sa1, respectively. In Eq. (15), $Sb1_{off}$ and $Sb1_{amp}$ represent the offset and the amplitude of the signal Sb1, respectively. The offset $Sa1_{off}$ and the amplitude $Sa1_{amp}$ are determined from the waveform for at least one period of the signal Sa1. The offset $Sb1_{off}$ and the amplitude $Sb1_{amp}$ are determined from the waveform for at least one period of the signal Sb1. The waveforms for at least one period of the signals Sa1 and Sb1 can be generated before shipment or use of the angle sensor system 1.

Each of Eqs. (14) and (15) contains a correction parameter C1. The correction parameter C1 has a value of 1 or near 1. When the correction parameter C1 is 1, Eqs. (14) and (15) represent fundamental operations for correcting the offsets and amplitudes of the signals Sa1 and Sb1. When the correction parameter C1 is 1, the signals Sa2 and Sb2 become equal in amplitude. When the correction parameter C1 is other than 1, the signals Sa2 and Sb2 do not become equal in amplitude.

Next, the angle computing unit 54 generates the first and second computation signals by performing operations using functions for correcting the phase. To be more specific, the angle computing unit 54 generates a first initial computation signal Scp using the function expressed by the following Eq. (16), and generates a second initial computation signal Sdp using the function expressed by the following Eq. (17).

$$Scp = Sa2 - Sb2 \quad (16)$$

$$Sdp = Sa2 + Sb2 \quad (17)$$

The angle computing unit 54 then generates the first computation signal Sc using the function expressed by the following Eq. (18), and generates the second computation signal Sd using the function expressed by the following Eq. (19).

$$Sc = Scp/Scp_{amp} \cdot C2 \quad (18)$$

$$Sd = Sdp/Sdp_{amp} \cdot C2 \quad (19)$$

In Eq. (18), $Scp_{amp}$ represents the amplitude of the first initial computation signal Scp. In Eq. (19), $Sdp_{amp}$ represents the amplitude of the second initial computation signal Sdp. The amplitudes $Scp_{amp}$ and $Sdp_{amp}$ are determined from the waveforms for at least one period of the first and second initial computation signals Scp and Sdp, respectively. The waveforms for at least one period of the first and second initial computation signals Scp and Sdp can be generated before shipment or use of the angle sensor system 1.

Each of Eqs. (18) and (19) contains a correction parameter C2. The correction parameter C2 has a value of 1 or near 1.

When both of the correction parameters C1 and C2 are 1, Eqs. (16) to (19) represent fundamental operations for making the phase difference between the first and second computation signals Sc and Sd be 90° and making the amplitudes of the first and second computation signals Sc and Sd equal. When the correction parameter C1 is other than 1, the phase difference between the first and second computation signals Sc and Sd becomes near 90°, although not exactly 90°. When the correction parameter C2 is other than 1, the first and second computation signals Sc and Sd do not become equal in amplitude.

Now, the relationship between the second-order angular error component and the correction parameters C1 and C2 will be described. The second-order angular error component contains a first component and a second component. The first component and the second component have a phase difference of 45°. The amplitude of the first component varies depending on the value of the correction parameter C1. The first component can thus be reduced by adjusting the value of the correction parameter C1 in accordance with the amplitude of the first component. The amplitude of the second component varies depending on the value of the correction parameter C2. The second component can thus be reduced by adjusting the value of the correction parameter C2 in accordance with the amplitude of the second component.

If the second-order angular error component is sufficiently low, the correction parameters C1 and C2 may each be set at 1.

Step S103 of calculating the detected angle value θs will now be described. The angle computation unit 54 calculates the detected angle value θs using the first and second computation signals Sc and Sd generated in step S102. To be more specific, for example, the angle computing unit 54 calculates θs using the following Eq. (20).

$$\theta s = a \tan(Sd/Sc) - \delta_1 \quad (20)$$

In Eq. (20), $\delta_1$ represents the phase difference between the detected angle value θs and the angle determined by the operation of a tan(Sd/Sc). When the first and second signals Sa and Sb are expressed by Eqs. (9) and (10), respectively, $\delta_1 = 45° + \alpha_1/2$.

For θs within the range of 0° to less than 360°, Eq. (20) yields two solutions that are 180° different in value. Which of the two solutions for θs in Eq. (20) is the true value of θs can be determined from the combination of positive and negative signs of Sc and Sd. The angle computing unit 54 determines θs within the range of 0° to less than 360° using Eq. (20) and the foregoing determination on the combination of positive and negative signs of Sc and Sd.

The second correction processing may be omitted if a sufficient reduction of angular error is achieved by calculating the detected angle value θs using the signals Sa1 and Sb1 obtained by the first correction processing. In such a case, the detected angle value θs is calculated by the same equation as Eq. (20) using the signals Sa1 and Sb1 in place of the first and second computation signals Sc and Sd.

Next, a description will be given of the method for generating the first and second signals Sa and Sb and the method for calculating the detected angle value θs according to the foregoing second example. The first computing circuit 52 generates the first signal Sa by performing the first operation of the second example, i.e., the operation to obtain the difference between the first and third detection signals S1 and S3. To be more specific, for example, the first computing circuit 52 generates the first signal Sa using the following Eq. (21). Eq. (21) uses the first and third detection signals S1 and S3 expressed by Eqs. (1) and (5), respectively. In the following description, $\alpha_2 = 360°/n$.

$$\begin{aligned}Sa &= S1 - S3 \\ &= \cos\theta + b_1 \cdot \cos(m\theta + g_1) \\ &\quad - \cos(\theta + \alpha_2) + b_1 \cdot \cos\{m(\theta + \alpha_2) + g_1\} \\ &= -2\sin(\theta + \alpha_2/2) \cdot \sin(-\alpha_2/2) \\ &\quad -2b_1 \cdot \sin\{m(\theta + \alpha_2/2) + g_1\} \cdot \sin(-m\alpha_2/2) \\ &= 2\sin(\alpha_2/2) \cdot \sin(\theta + \alpha_2/2) \\ &\quad +2b_1 \cdot \sin(m\alpha_2/2) \cdot \sin\{m(\theta + \alpha_2/2) + g_1\}\end{aligned} \quad (21)$$

The second computing circuit 53 generates the second signal Sb by performing the second operation of the second example, i.e., the operation to obtain the difference between the second and fourth detection signals S2 and S4. To be more specific, for example, the second computing circuit 53 generates the second signal Sb using the following Eq. (22). Eq. (22) uses the second and fourth detection signals S2 and S4 expressed by Eqs. (2) and (6), respectively.

$$\begin{aligned}Sb &= S4 - S2 \\ &= \sin(\theta + \alpha_2) + b_2 \cdot \sin\{m(\theta + \alpha_2) + g_2\} \\ &\quad -\sin\theta - b_2 \cdot \sin(m\theta + g_2) \\ &= 2\sin(\alpha_2/2) \cdot \cos(\theta + \alpha_2/2) \\ &\quad +2b_2 \cdot \sin(m\alpha_2/2) \cdot \cos\{m(\theta + \alpha_2/2) + g_2\}\end{aligned} \quad (22)$$

When $\beta_2 = 2\sin(\alpha_2/2)$, $\gamma_{21} = 2b_1 \cdot \sin(m\alpha_2/2)$, $\gamma_{22} = 2b_2 \cdot \sin(m\alpha_2/2)$, and $\phi_2 = \theta + \alpha_2/2$, the first and second signals Sa and Sb are expressed by the following Eqs. (23) and (24), respectively.

$$Sa = \beta_2 \cdot \sin\phi_2 + \gamma_{21} \cdot \sin(m\phi_2 + g_1) \quad (23)$$

$$Sb = \beta_2 \cdot \cos\phi_2 + \gamma_{22} \cdot \cos(m\phi_2 + g_2) \quad (24)$$

In Eq. (23), "$\gamma_{21} \cdot \sin(m\phi_2+g_1)$" is the second error component contained in the first signal Sa. In Eq. (24), "$\gamma_{22} \cdot \cos(m\phi_2+g_2)$" is the second error component contained in the second signal Sb.

Processing to be performed by the angle computing unit 54 will now be described. The angle computing unit 54 performs basically the same processing as in the first example. Specifically, as shown in FIG. 7, the processing to be performed by the angle computing unit 54 includes step S101 of performing first correction processing, step S102 of performing second correction processing, and step S103 of calculating the detected angle value θs. Steps S101, S102 and S103 are performed in this order. In the second example also, the angle computing unit 54 generates the signals Sa1 and Sb1, the signals Sa2 and Sb2, the first and second initial computation signals Scp and Sdp, and the first and second computation signals Sc and Sd in succession. However, equations for generating the signals Sa1 and Sb1, equations for generating the first and second initial computation signals Scp and Sdp, and an equation for generating the detected angle value θs in the second example are different from those in the first example.

First, the equations for generating the signals Sa1 and Sb1 in the second example will be described. In the second example, the signals Sa1 and Sb1 are expressed by the following Eqs. (25) and (26), respectively.

$$Sa1 = Sa - F_{21} \cdot \sin(m\phi p_2 + G_1) \quad (25)$$

$$Sb1 = Sb - F_{22} \cdot \cos(m\phi p_2 + G_2) \quad (26)$$

In Eq. (25), "$F_{21} \cdot \sin(m\phi p_2+G_1)$" is an estimated value of the second error component of the first signal Sa. In Eq. (26), "$F_{22} \cdot \cos(m\phi p_2+G_2)$" is an estimated value of the second error component of the second signal Sb. $F_{21}$, $F_{22}$, $G_1$, and $G_2$ are values corresponding to $\gamma_{21}$, $\gamma_{22}$, $g_1$, and $g_2$, respectively. The values $F_{21}$, $F_{22}$, $G_1$, and $G_2$ can be determined on the basis of the results of applying a Fourier transform to the waveform of each of the first and second signals Sa and Sb. Further, $\phi p_2$ is calculated from the following Eq. (27) using the first and second signals Sa and Sb. Like $\phi p_1$ in Eq. (13), $\phi p_2$ is calculated within the range of 0° to less than 360°.

$$\phi p_2 = a\tan(Sa/Sb) \quad (27)$$

Next, the equations for generating the first and second initial computation signals Scp and Sdp in the second example will be described. In the second example, the angle computing unit 54 generates the first initial computation signal Scp using the function expressed by the following Eq. (28), and generates the second initial computation signal Sdp using the function expressed by the following Eq. (29).

$$Scp = Sb2 - Sa2 \quad (28)$$

$$Sdp = Sb2 + Sa2 \quad (29)$$

Next, the equation for generating the detected angle value θs in the second example will be described. In the second example, the angle computing unit 54 calculates θs using the following Eq. (30). Like θs in Eq. (20), θs in Eq. (30) is calculated within the range of 0° to less than 360°.

$$\theta s = a\tan(Sd/Sc) - \delta_2 \quad (30)$$

In Eq. (30), $\delta_2$ represents the phase difference between the detected angle value θs and the angle determined by the operation of a tan(Sd/Sc). When the first and second signals Sa and Sb are expressed by Eqs. (23) and (24), respectively, $\delta_2 = 45° + \alpha_2/2$.

As described above, in the angle sensor 2 and the angle sensor system 1 according to the present embodiment, the first detection unit 10 and the second detection unit 20 are arranged in a predetermined positional relationship, and the first and second computing circuits 52 and 53 perform relatively simple operations, such as addition and subtraction, to yield the first and second signals Sa and Sb that are lower in the first error component corresponding to an n-th harmonic. Further, the angle computing unit 53 performs the first correction processing to reduce the second angular error component resulting from the second error component corresponding to an m-th harmonic. Thus, according to the present embodiment, when each of the plurality of detection signals contains two error components corresponding to two harmonics of different orders, it is possible to reduce the angular error caused by the two error components.

To reduce the angular error when each detection signal contains the aforementioned two error components, there is conceivable a method in which the angle computing unit 54 corrects each detection signal so as to reduce the two error components contained in each detection signal. However, such a method greatly complicates the processing to be performed by the angle computing unit 54.

In contrast, the present embodiment reduces the first angular error component resulting from the first error component by using the positional relationship between the first and second detection units 10 and 20 and the first and second operations, which are relatively simple operations, performed by the first and second computing circuits 52 and 53. Thus, the correction processing to be performed by the angle computing unit 54 need not include processing for reducing the first angular error component.

In the case where the correction processing by the angle computing unit 54 is to reduce an angular error component resulting from one of the two error components corresponding to two harmonics of different orders, the correction processing is easier when reducing the angular error component resulting from the error component corresponding to the lower-order harmonic. In the present embodiment, the correction processing by the angle computing unit 54, particularly the first correction processing, reduces the second angular error component which results from the second error component corresponding to the m-th harmonic, which is the lower-order harmonic of the two harmonics of different orders, n-th and m-th.

Thus, when each of a plurality of detection signals contains two error components corresponding to two harmonics of different orders, the present embodiment enables easy reduction of an angular error resulting from the two error components.

If one attempts to generate two signals in each of which both of the first and second error components are reduced by using only the positional relationship between the detection units and relatively simple operations such as addition and subtraction, it becomes necessary to provide twice as many detection units as the detection units of the present embodiment. In contrast, according to the present embodiment, the first and second signals Sa and Sb in each of which only the first error component is reduced are generated using the positional relationship between the first and second detection units 10 and 20 and the first and second operations, which are relatively simple operations, performed by the first and second computing circuits 52 and 53. The present embodiment thus enables reduction in the number of the detection units relative to the case of generating two signals in each of which both of the first error component and the second error components are reduced. The present embodiment thereby enables the angle sensor 2 to be simplified in configuration and reduced in size. From this point of view also, the present embodiment facilitates reduction of the angular error resulting from two error components.

Further, if one attempts to generate two signals in each of which the second error component is reduced by using only the positional relationship between the first and second detection units 10 and 20 and the operations performed by the first and second computing circuits 52 and 53, it is necessary that the first and second positions P1 and P2 be defined to make the angle θ1 of FIG. 3 have a magnitude equivalent to an electrical angle of 180°/m or 360°/m. In the present embodiment, the first and second positions P1 and P2 are defined to make the angle θ1 of FIG. 3 have a magnitude equivalent to an electrical angle of 180°/n or 360°/n. Since n is greater than m, 180°/n is smaller than 180°/m, and 360°/n is smaller than 360°/m. Thus, the present embodiment allows the angle θ1 to be smaller than in the case of generating two signals in each of which the second error component is reduced. The present embodiment thereby enables reduction in size of the angle sensor 2. Further, according to the present embodiment, the first detection unit 10 and the second detection unit 20 can be integrated into a single component. This makes it possible to prevent an angular error from occurring due to a misalignment between the first detection unit 10 and the second detection unit 20.

Further, the present embodiment enables reduction of the angular error resulting from the first error component when the causes of distortion of the waveform of each of the first to fourth detection signals S1 to S4 include at least one of the first cause and the second cause mentioned previously.

Now, the angular error-reducing effect of the present embodiment will be specifically shown in comparison with angle sensor systems of first and second comparative examples. Each of the angle sensor systems of the first and second comparative examples includes an angle sensor of a comparative example, in place of the angle sensor 2 according to the present embodiment. The angle sensor of the comparative example includes the first detection unit 10 shown in FIG. 1 to FIG. 4 and an angle computing unit of the comparative example.

In the first comparative example, the angle computing unit of the comparative example calculates a detected angle value θp1 of the first comparative example using the first detection signal S1 and the second detection signal S2.

In the second comparative example, the angle computing unit of the comparative example first performs processing similar to the first correction processing (step S101) on the first detection signal S1 to generate a signal S1a that is lower in the second error component than the first detection signal S1, and performs processing similar to the first correction processing (step S101) on the second detection signal S2 to generate a signal S2a that is lower in the second error component than the second detection signal S2. The angle computing unit of the comparative example then calculates a detected angle value θp2 of the second comparative example using the signals S1a and S2a.

The detected angle values θp1 and θp2 of the first and second comparative examples are calculated by the following Eqs. (31) and (32), respectively. Like φp$_1$ in Eq. (13), θp1 and θp2 are calculated within the range of 0° to less than 360°.

$$\theta p1 = a\tan(S2/S1) \quad (31)$$

$$\theta p2 = a\tan(S2a/S1a) \quad (32)$$

For the first example of the present embodiment, we let θt represent a detected angle value that is calculated using the signals Sa1 and Sb1 yielded by the first correction processing without the second correction processing. The detected angle value et is calculated by the following Eq. (33). Like θs in Eq. (20), θt is calculated within the range of 0° to less than 360°.

$$\theta t = a\tan(Sb1/Sa1) - \alpha_1/2 \quad (33)$$

An angular error occurring in the detected angle value θp1 of the first comparative example will be denoted by the symbol Ep1. An angular error occurring in the detected angle value θp2 of the second comparative example will be denoted by the symbol Ep2. An angular error occurring in the detected angle value et will be denoted by the symbol Et. Further, an angular error occurring in the detected angle value θs in the case where the first correction processing and the second correction processing are performed in the first example will be denoted by the symbol Es. The angular errors Ep1 and Ep2 are calculated by a control unit (not illustrated) outside the angle sensor systems of the first and second comparative examples under a situation in which the control unit can recognize the true angle to be detected by the angle sensor of the comparative example. Likewise, the angular errors Et and Es are calculated by a control unit (not illustrated) outside the angle sensor system 1 according to the present embodiment under a situation in which the control unit can recognize the true angle to be detected by the angle sensor 2. Examples of such situations include when the control unit commands a change of the true angle to be detected, and when the control unit is able to obtain information about the true angle to be detected. The true angle to be detected is, for example, the rotational angle of the magnetic field generation unit 5. The true angle to be detected that the control unit recognizes will hereinafter be referred to as the reference angle θr, in particular. The ideal angle θ corresponds to the true angle to be detected and the reference angle θr. The angular errors Ep1, Ep2, Et, and Es are calculated by the following Eqs. (34), (35), (36), and (37), respectively.

$$Ep1 = \theta p1 - \theta r \quad (34)$$

$$Ep2 = \theta p2 - \theta r \quad (35)$$

$$Et = \theta t - \theta r \quad (36)$$

$$Es = \theta s - \theta r \quad (37)$$

Figure 8:
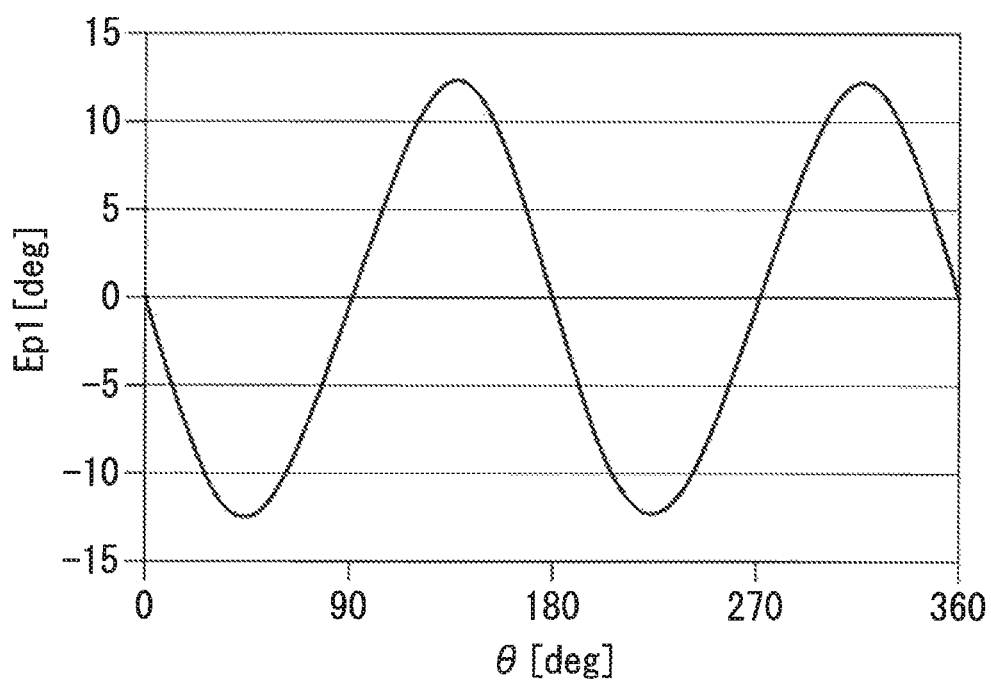
FIG. 8 is a waveform diagram illustrating an example waveform of an angular error occurring in a detected angle value of a first comparative example.
Figure 9:
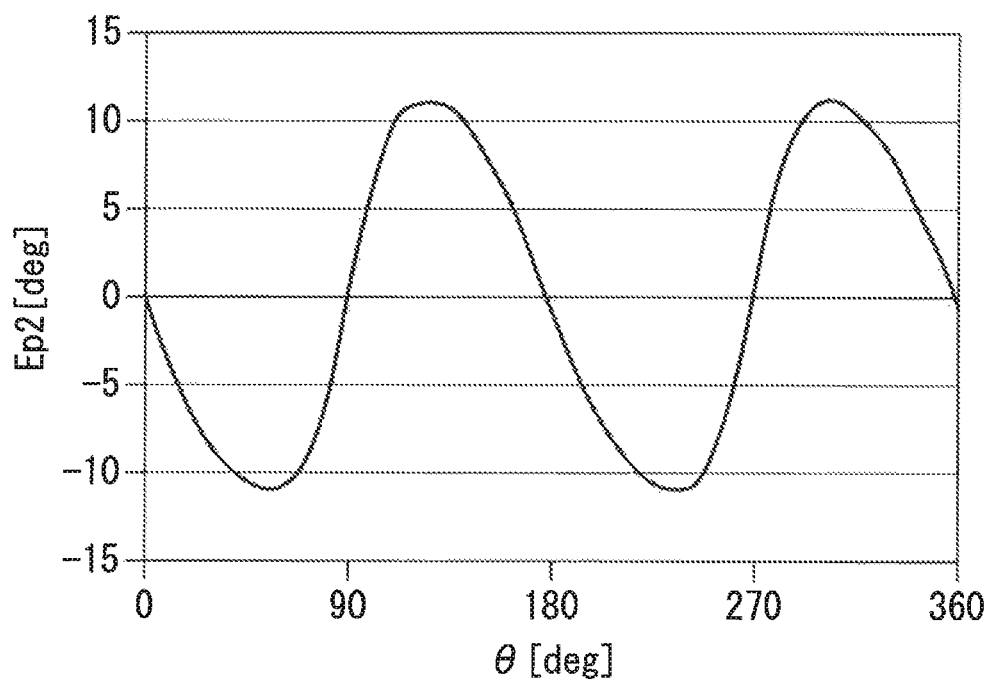
FIG. 9 is a waveform diagram illustrating an example waveform of an angular error occurring in a detected angle value of a second comparative example.
Figure 10:
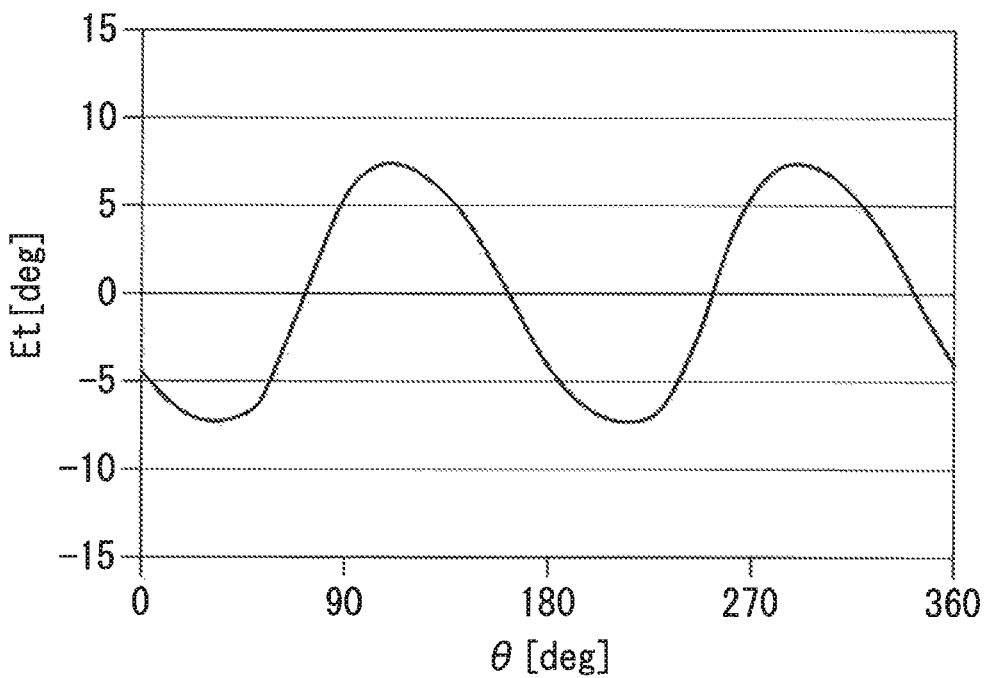
FIG. 10 is a waveform diagram illustrating an example waveform of an angular error that results when no second correction processing is performed in a first example of the first embodiment of the invention.
Figure 11:
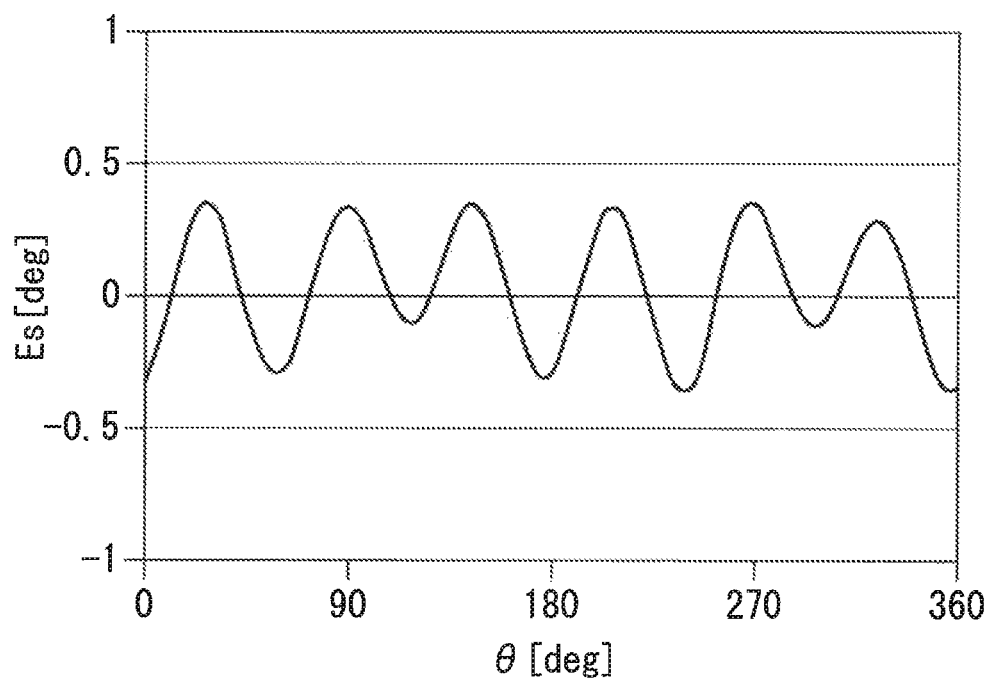
FIG. 11 is a waveform diagram illustrating an example waveform of an angular error that results when first correction processing and second correction processing are performed in the first example of the first embodiment of the invention.

FIG. 8 is a waveform diagram illustrating an example waveform of the angular error Ep1. FIG. 9 is a waveform diagram illustrating an example waveform of the angular error Ep2. FIG. 10 is a waveform diagram illustrating an example waveform of the angular error Et. FIG. 11 is a waveform diagram illustrating an example waveform of the angular error Es. In each of FIGS. 8 to 11, the horizontal axis represents the ideal angle θ equal to the reference angle θr. The vertical axes in FIGS. 8, 9, 10 and 11 represent the magnitudes of the angular errors Ep1, Ep2, Et and Es, respectively.

As shown in FIGS. 8 and 9, the angular error Ep2 is smaller than the angular error Ep1. This indicates that the first correction processing (step S101) reduces the second angular error component resulting from the second error component.

As shown in FIGS. 9 and 10, the angular error Et is smaller than the angular error Ep2. This indicates that the present embodiment reduces the angular error resulting from the first and second error components.

As shown in FIGS. 10 and 11, the angular error Es is smaller than the angular error Et. This indicates that the second correction processing of the present embodiment reduces the second-order angular error component.

Second Embodiment

A second embodiment of the present invention will now be described. The angle sensor system and the angle sensor according to the second embodiment are configured in the same manner as the angle sensor system 1 and the angle sensor 2 according to the first embodiment. However, in the second embodiment, the angle computing unit 54 (see FIG. 5) performs different processing from that in the first embodiment. As has been described in relation to the first embodiment, each of the first to fourth detection signals S1 to S4 contains the ideal component, the first error component, and the second error component. The second error component is an error component corresponding to the m-th harmonic of the ideal component. As in the first embodiment, m is 3.

When the direction DM of a rotating magnetic field MF varies with a predetermined period, the second angular error component includes a component that varies with a period of ½ the predetermined period, in other words, a component that can be referred to as the second-order angular error component, and another component, such as a component that varies with a period of ¼ the predetermined period. When the whole or almost the whole of the second angular error component is the second-order angular error component, the second angular error component can be reduced sufficiently by only the second correction processing of the first embodiment, without performing the first correction processing of the first embodiment. The present embodiment describes an example of such a case.

The angle computing unit 54 performs correction processing by which the second angular error component is reduced relative to the case where the correction processing is not performed. The correction processing of the present embodiment is the same as the second correction processing of the first embodiment. The correction processing of the present embodiment is simpler than the correction processing of the first embodiment which includes the first correction processing and the second correction processing. Thus, the present embodiment enables reducing the second angular error component and the second-order angular error component by simpler correction processing than that of the first embodiment.

The correction processing of the present embodiment will now be described specifically. Like the first correction processing and the second correction processing of the first embodiment, the correction processing of the present embodiment includes performing conversion operations to convert the first and second signals Sa and Sb into the first and second computation signals Sc and Sd to be used for angle computation for calculating the detected angle value θs. In the correction processing of the present embodiment, the angle computing unit 54 generates the signals Sa2 and Sb2, the first and second initial computation signals Scp and Sdp, and the first and second computation signals Sc and Sd in succession, as in the second correction processing of the first embodiment. However, equations for generating the signals Sa2 and Sb2 in the present embodiment are different from those in the first embodiment. In the present embodiment, the angle computing unit 54 generates the signal Sa2 using the function expressed by the following Eq. (38), and generates the signal Sb2 using the function expressed by the following Eq. (39).

$$Sa2=(Sa-Sa_{off})/Sa_{amp}/C1 \quad (38)$$

$$Sb2=(Sb-Sb_{off})/Sb_{amp} \cdot C1 \quad (39)$$

In Eq. (38), $Sa_{off}$ and $Sa_{amp}$ represent the offset and the amplitude of the first signal Sa, respectively. In Eq. (39), $Sb_{off}$ and $Sb_{amp}$ represent the offset and the amplitude of the second signal Sb, respectively. The offset $Sa_{off}$ and the amplitude $Sa_{amp}$ are determined from the waveform for at least one period of the first signal Sa. The offset $Sb_{off}$ and the amplitude $Sb_{amp}$ are determined from the waveform for at least one period of the second signal Sb. The waveforms for at least one period of the signals Sa and Sb can be generated before shipment or use of the angle sensor system 1.

Each of Eqs. (38) and (39) contains a correction parameter C1. The details of the correction parameter C1 are the same as in the first embodiment.

In the present embodiment, a series of operations to generate the first and second computation signals Sc and Sd from the signals Sa2 and Sb2 correspond to the conversion operations. In the present embodiment, the conversion operations convert the first and second signals Sa and Sb into the first and second computation signals Sc and Sd so that the second angular error component and the second-order angular error component are reduced relative to the case where the detected angle value θs is calculated by performing angle computation using the first and second signals Sa and Sb.

As has been described in relation to the first embodiment, the first detection unit 10 and the second detection unit 20 (see FIG. 1 to FIG. 4) are arranged in a positional relationship that establishes a first phase relationship between the ideal components of the first and third detection signals S1 and S3, and a second phase relationship between the ideal components of the second and fourth detection signals S2 and S4. The positional relationship between the first and second detection units 10 and 20 and the first and second phase relationships in the present embodiment may be the same as those in the first example of the first embodiment, or may be the same as those in the second example of the first embodiment. The former case will be referred to as the first example of the present embodiment, and the latter case will be referred to as the second example of the present embodiment. In the first example of the present embodiment, the first and second signals Sa and Sb and the detected angle value θs are generated in the same manner as in the first example of the first embodiment. In the second example of the present embodiment, the first and second signals Sa and Sb and the detected angle value θs are generated in the same manner as in the second example of the first embodiment. In both of the first example and the second example of the present embodiment, the correction processing of the present embodiment is performed instead of the first correction processing and the second correction processing of the first embodiment.

Now, the angular error-reducing effect of the present embodiment will be specifically shown in comparison with angle sensor systems of third and fourth comparative examples. The angle sensor system of the third comparative example includes an angle sensor of the third comparative example, in place of the angle sensor 2 according to the present embodiment. The angle sensor of the third comparative example includes the first detection unit 10 of the first embodiment shown in FIG. 1 to FIG. 4, and an angle computing unit of the third comparative example. The angle computing unit of the third comparative example calculates a detected angle value θp3 of the third comparative example using the first detection signal S1 and the second detection signal S2.

The angle sensor system of the fourth comparative example includes an angle sensor of the fourth comparative example, in place of the angle sensor 2 according to the present embodiment. The angle sensor of the fourth comparative example has basically the same configuration as that of the angle sensor according to the present embodiment (the angle sensor 2 according to the first embodiment). In the fourth comparative example, the first and second detection units 10 and 20 are arranged in the same positional relationship as that in the first example of the first embodiment. The angle detection unit 50 (see FIG. 5) includes an angle computing unit of the fourth comparative example, in place of the angle computing unit 54.

In the fourth comparative example, the first and second signals Sa and Sb are generated by the operations performed by the first and second computing circuits 52 and 53 (see FIG. 5), as in the first example of the first embodiment. The angle computing unit of the fourth comparative example calculates a detected angle value θp4 of the fourth comparative example using the first signal Sa and the second signal Sb, without performing the correction processing of the present embodiment.

The detected angle values θp3 and θp4 of the third and fourth comparative examples are calculated by the following Eqs. (40) and (41), respectively. Like the detected angle values θp1 and θp2 of the first and second comparative examples described in relation to the first embodiment, θp3 and θp4 are calculated within the range of 0° to less than 360°. In Eq. (41), $\alpha_1=180°/n$.

$$\theta p3 = a\tan(S2/S1) \quad (40)$$

$$\theta p4 = a\tan(Sb/Sa) - \alpha_1/2 \quad (41)$$

An angular error occurring in the detected angle value θp3 of the third comparative example will be denoted by the symbol Ep3. An angular error occurring in the detected angle value θp4 of the fourth comparative example will be denoted by the symbol Ep4. The angular errors Ep3 and Ep4 are calculated by a control unit (not illustrated) outside the angle sensor systems of the third and fourth comparative examples under a situation in which the control unit can recognize the reference angle θr described in relation to the first embodiment. The angular errors Ep3 and Ep4 are calculated by the following Eqs. (42) and (43), respectively.

$$Ep3 = \theta p3 - \theta r \quad (42)$$

$$Ep4 = \theta p4 - \theta r \quad (43)$$

An angular error occurring in the detected angle value θs generated according to the first example of the present embodiment will be denoted by the symbol Es. The angular error Es is calculated in the same manner as in the first embodiment.

Figure 12:
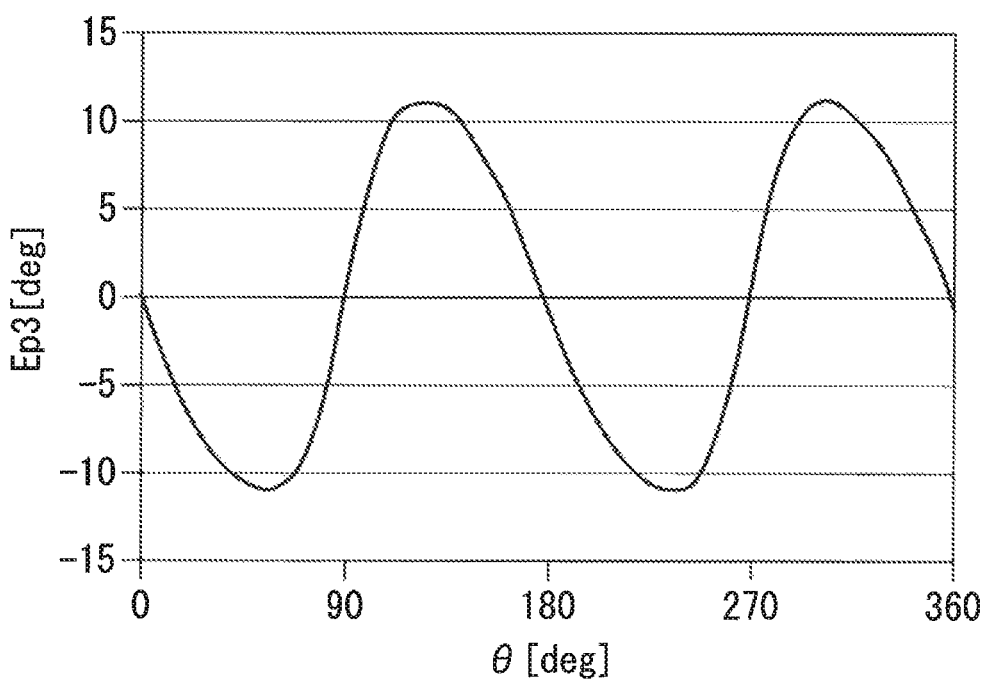
FIG. 12 is a waveform diagram illustrating an example waveform of an angular error occurring in a detected angle value of a third comparative example.
Figure 13:
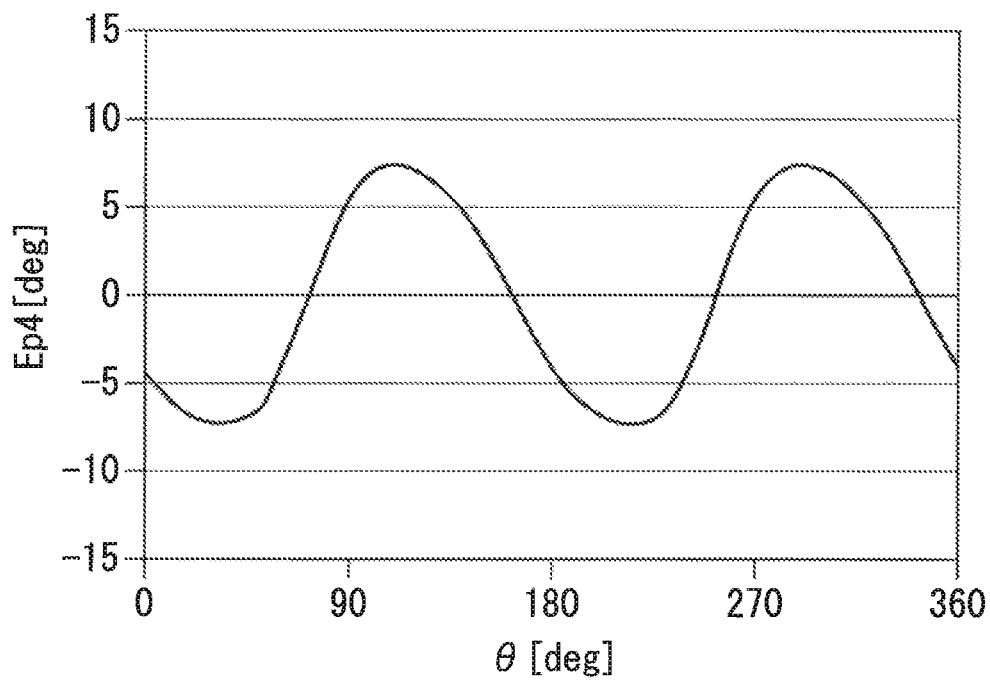
FIG. 13 is a waveform diagram illustrating an example waveform of an angular error occurring in a detected angle value of a fourth comparative example.
Figure 14:
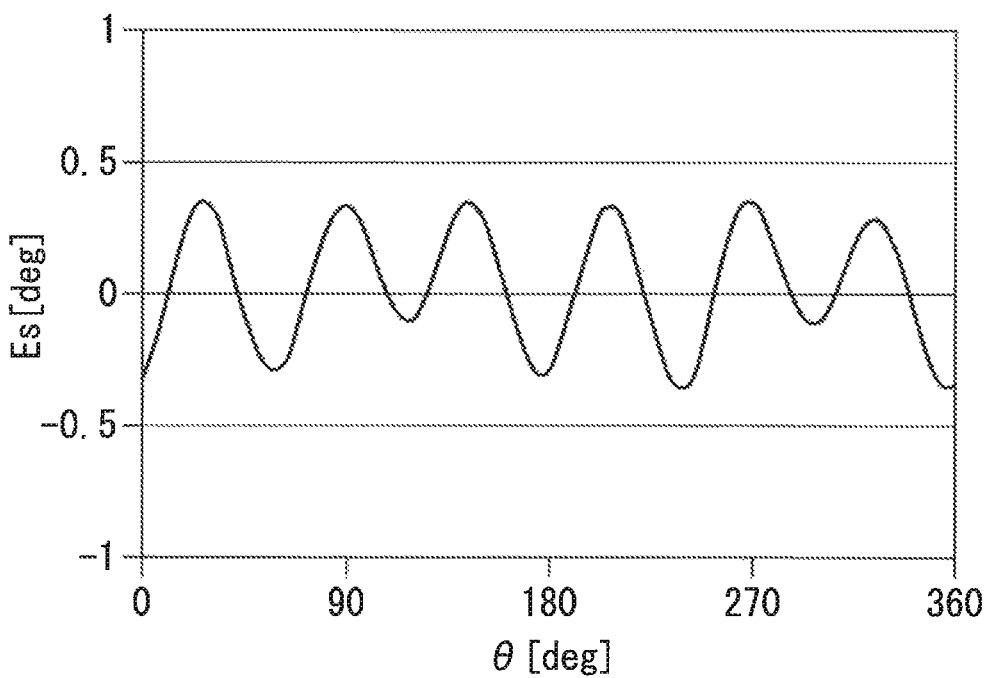
FIG. 14 is a waveform diagram illustrating an example waveform of an angular error that results when correction processing is performed in a first example of a second embodiment of the invention.

FIG. 12 is a waveform diagram illustrating an example waveform of the angular error Ep3. FIG. 13 is a waveform diagram illustrating an example waveform of the angular error Ep4. FIG. 14 is a waveform diagram illustrating an example waveform of the angular error Es. In each of FIGS. 12 to 14, the horizontal axis represents the ideal angle θ equal to the reference angle θr. The vertical axes in FIGS. 12, 13 and 14 represent the magnitudes of the angular errors Ep3, Ep4 and Es, respectively.

As shown in FIGS. 12 and 13, the angular error Ep4 is smaller than the angular error Ep3. This indicates that the first angular error component resulting from the first error component can be reduced using the positional relationship between the first and second detection units 10 and 20 and the operations performed by the first and second computing circuits 52 and 53.

As shown in FIGS. 13 and 14, the angular error Es is smaller than the angular error Ep4. This indicates that the second angular error component resulting from the second error component can also be reduced by the correction processing.

The other configuration, function and effects of the present embodiment are the same as those of the first embodiment.

Third Embodiment

A third embodiment of the present invention will now be described. First, reference is made to FIG. 15 to describe the general configuration of an angle sensor system according to the third embodiment. The angle sensor system 1 according to the third embodiment differs from that according to the first embodiment in the following ways. The angle sensor system 1 according to the third embodiment includes a magnetic field generation unit 7 in place of the magnetic field generation unit 5 of the first embodiment. The magnetic field generation unit 7 of the third embodiment is a magnet of a cylindrical shape for generating a rotating magnetic field MF whose direction rotates. The magnetic field generation unit 7 rotates about a central axis C in a rotational direction D.

Figure 15:
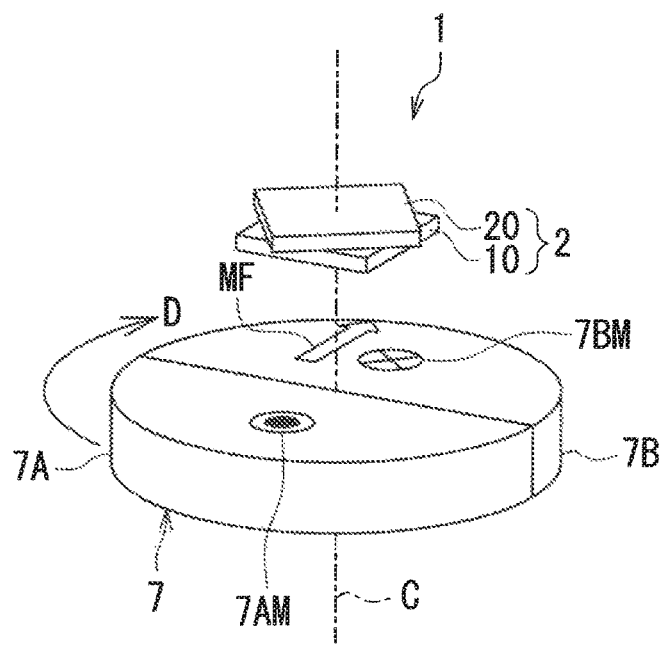
FIG. 15 is a perspective view illustrating the general configuration of an angle sensor system according to a third embodiment of the invention.

The magnetic field generation unit 7 includes a first portion 7A and a second portion 7B magnetized in mutually different directions. The first portion 7A and the second portion 7B are arranged symmetrically with respect to an imaginary plane including the central axis of the cylindrical shape. In FIG. 15, the symbol 7AM represents the magnetization direction of the first portion 7A, and the symbol 7BM represents the magnetization direction of the second portion 7B. The magnetization direction 7AM of the first portion 7A is parallel to the central axis C. The magnetization direction 7AM is upward in FIG. 15. The magnetization direction 7BM of the second portion 7B is opposite to the direction 7AM.

In the present embodiment, the first and second detection units 10 and 20 of the angle sensor 2 are arranged to face an end face of the magnetic field generation unit 7. For ease of understanding, FIG. 15 illustrates the first and second detection units 10 and 20 as separate components. However, the first and second detection units 10 and 20 may be integrated into a single component. Further, while in FIG. 15 the first and second detection units 10 and 20 are stacked in a direction parallel to the central axis C, the order of stacking may be inversed from that shown in FIG. 15. The magnetic field generation unit 7 varies its relative position with respect to the first and second detection units 10 and 20 in the rotational direction D.

The angle sensor system 1 according to the present embodiment may be configured in other ways than illustrated in FIG. 15. For example, the magnetic field generation unit 7 and the first and second detection units 10 and 20 arranged as illustrated in FIG. 15 may be configured so that: the first and second detection units 10 and 20 rotate while the magnetic field generation unit 7 is fixed; the magnetic field generation unit 7 and the detection units 10, 20 rotate in mutually opposite directions; or the magnetic field generation unit 7 and the detection units 10, 20 rotate in the same direction with mutually different angular velocities. In all the cases, the relative position of the magnetic field generation unit 7 with respect to the first and second detection units 10 and 20 rotates about the central axis C in the rotational direction D.

Figure 16:
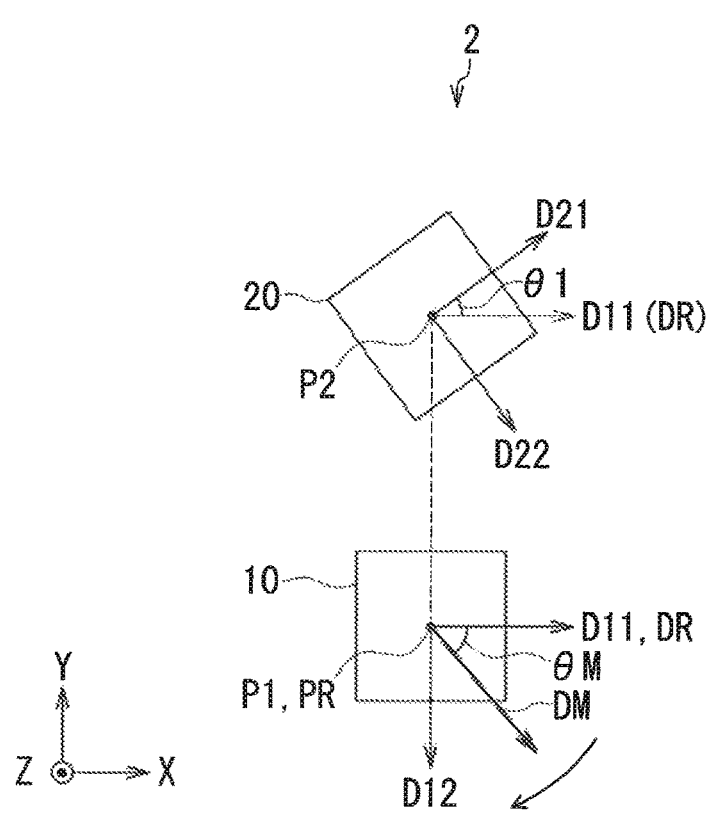
FIG. 16 is an explanatory diagram illustrating the definitions of directions and angles used in the third embodiment of the invention.

Now, the definitions of directions and angles used in the present embodiment will be described with reference to FIGS. 15 and 16. In the present embodiment, the Z direction is the direction parallel to the central axis C shown in FIG. 15 and upward in FIG. 15. In FIG. 16, the X direction is rightward, the Y direction is upward, and the Z direction is out of the plane of the drawing.

As has been described in relation to the first embodiment, the first and second detection units 10 and 20 detect the rotating magnetic field MF in the first and second positions P1 and P2, respectively. In the present embodiment, the first and second positions P1 and P2 coincide with each other in the rotational direction D so that the direction DM of the rotating magnetic field MF in the first position P1 and that in the second position P2 are the same.

The reference plane in the present embodiment is parallel to one of the end faces of the magnetic field generation unit 7 and perpendicular to the central axis C. In the present embodiment, the first position P1 is the reference position PR, and the X direction is the reference direction DR. Assume that the direction DM of the rotating magnetic field MF rotates clockwise in FIG. 16. The angle that the direction DM of the rotating magnetic field MF in the reference position PR forms with respect to the reference direction DR, i.e., the rotating field angle θM, will be expressed in positive values when seen clockwise from the reference direction DR, and in negative values when seen counterclockwise from the reference direction DR.

A first direction D11, a second direction D21, a third direction D12, and a fourth direction D22 will be defined as shown in FIG. 16. The first to fourth directions D11, D21, D12 and D22 are all parallel to the reference plane. The first and second directions D11 and D21 are different from each other. In the present embodiment, the first direction D11 is the same as the X direction and the reference direction DR. The second direction D21 is a direction that is rotated counterclockwise from the first direction D11 by an angle θ1. The specific value of the angle θ1 will be described later.

The third and fourth directions D12 and D22 are directions that are rotated by a predetermined angle from the first and second directions D11 and D21, respectively. In the present embodiment, the third and fourth directions D12 and D22 are directions that are rotated clockwise by 90° from the first and second directions D11 and D21, respectively.

In the present embodiment, the first and second detection units 10 and 20 are arranged in such a positional relationship that the first and second directions D11 and D21 are different from each other while the direction DM of the rotating magnetic field MF in the first position P1 and that in the second position P2 are the same.

The relationships between the magnetization directions of the magnetization pinned layers in the first and second detection units 10 and 20 and the first to fourth directions D11, D21, D12 and D22 are the same as those in the first embodiment.

As in the first embodiment, the first and second detection units 10 and 20 may be constructed of two discrete components. The two discrete components may have the same mechanical structure and be configured so that the magnetizations of the plurality of magnetization pinned layers are in the same relative direction with respect to the mechanical structure. In such a case, the second detection unit 20 is placed in an orientation rotated counterclockwise by the angle θ1 with respect to the first detection unit 10.

Alternatively, the first and second detection units 10 and 20 may have the same mechanical structure and be placed in the same orientation while the magnetization pinned layers of the MR elements included therein have respective magnetization directions determined for the respective corresponding MR elements.

The first and second detection units 10 and 20 are arranged in a positional relationship that establishes the first and second phase relationships described in relation to the first embodiment. Now, a description will be given of a first example and a second example of the present embodiment. The first example will be described first. The first and second phase relationships according to the first example of the present embodiment are the same as those according to the first example of the first embodiment. In the first example, the first and second detection units 10 and 20 are arranged to establish the first and second phase relationships according to the first example. To be more specific, the first and second directions D11 and D21 are defined to make the angle θ1 of FIG. 16 have a magnitude equivalent to an electrical angle of 180°/n.

In the present embodiment, in particular, n is 5. Thus, 180°/n is 36°. One period of the first to fourth detection signals S1 to S4, i.e., an electrical angle of 360°, is equivalent to one rotation of the magnetic field generation unit 7, i.e., a rotational angle of 360° of the magnetic field generation unit 7. Thus, in the first example, the first and second directions D11 and D21 are defined to make the angle θ1 be 36°.

According to the first example, when it is the second cause that distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are respectively expressible by Eqs. (3) and (4) of the first embodiment.

The second example will now be described. The first and second phase relationships according to the second example of the present embodiment are the same as those according to the second example of the first embodiment. In the second example, the first and second detection units 10 and 20 are arranged to establish the first and second phase relationships according to the second example. To be more specific, the first and second directions D11 and D21 are defined to make the angle θ1 of FIG. 16 have a magnitude equivalent to an electrical angle of 360°/n.

In the present embodiment, in particular, 360°/n is 72°. In the second example, the first and second directions D11 and D21 are defined to make the angle θ1 be 72°.

According to the second example, when it is the second cause that distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are respectively expressible by Eqs. (5) and (6) of the first embodiment.

The present embodiment enables reduction of the angular error resulting from the first error component when the causes of distortion of the waveform of each of the first to fourth detection signals S1 to S4 include the second cause.

The positional relationship between the first detection unit 10 and the second detection unit 20 of the present embodiment may be applied to the angle sensor system 1 according to the first embodiment. The other configuration, function and effects of the present embodiment are the same as those of the first embodiment.

Fourth Embodiment

A fourth embodiment of the present invention will now be described. First, reference is made to FIG. 17 to describe the general configuration of an angle sensor system according to the fourth embodiment. The angle sensor system 1 according to the fourth embodiment differs from that according to the first embodiment in the following ways. The angle sensor system 1 according to the fourth embodiment includes a magnetic field generation unit 8, in place of the magnetic field generation unit 5 of the first embodiment.

Figure 17:
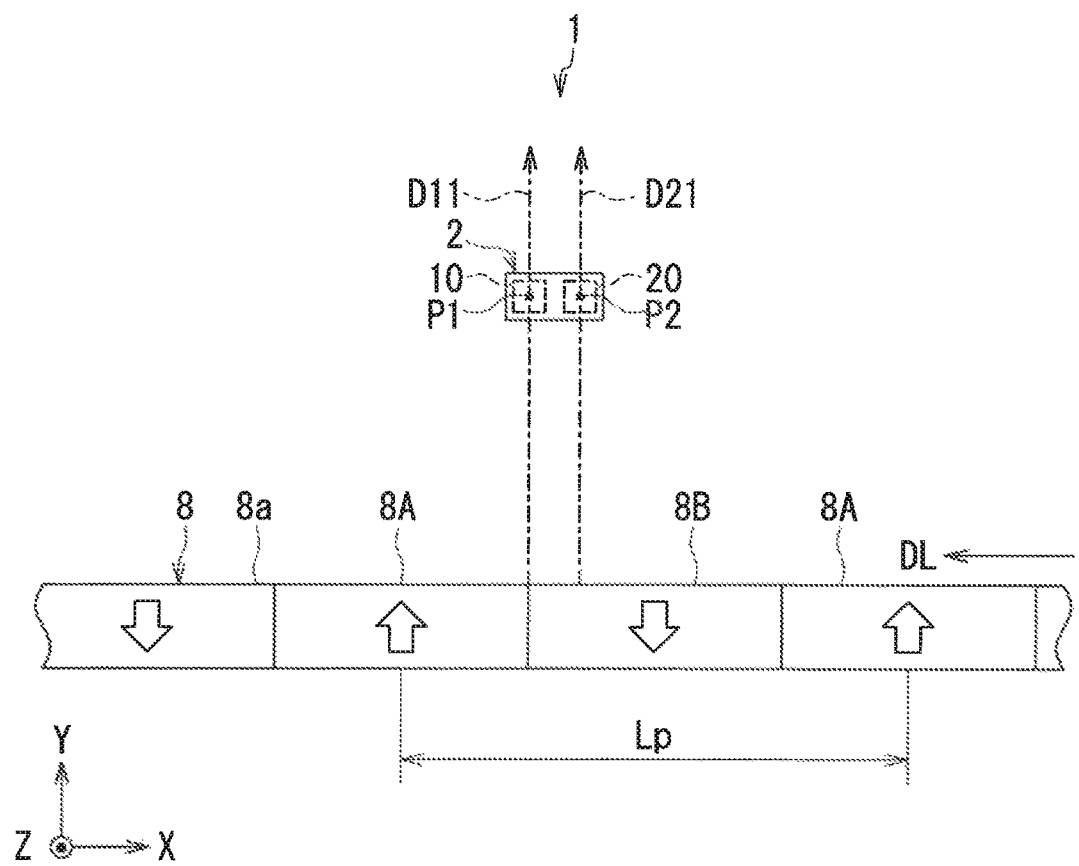
FIG. 17 is an explanatory diagram illustrating the general configuration of an angle sensor system according to a fourth embodiment of the invention.

In FIG. 17, the X direction is rightward, the Y direction is upward, and the Z direction is out of the plane of the drawing. The magnetic field generation unit 8 includes a plurality of sets of the first and second portions 8A and 8B arranged alternately in a linear configuration along the X direction. The first portion 8A and the second portion 8B are magnetized in mutually opposite directions. In FIG. 17, the hollow arrows indicate the magnetization directions of the portions 8A and 8B. In FIG. 17, each first portion 8A is magnetized in the Y direction, and each second portion 8B is magnetized in the opposite direction thereto.

The magnetic field generation unit 8 has a side surface 8a parallel to the X direction. In the present embodiment, the first and second detection units 10 and 20 of the angle sensor 2 are arranged to face the side surface 8a of the magnetic field generation unit 8.

One of the angle sensor 2 and the magnetic field generation unit 8 moves linearly in response to the movement of a moving body (not illustrated). This varies the relative position of the magnetic field generation unit 8 with respect to the first and second detection units 10 and 20 in a predetermined direction DL. The direction DL is parallel to the X direction. In the example shown in FIG. 17, the direction DL is the −X direction.

Now, the arrangement of the first and second detection units 10 and 20 and the definitions of directions and angles in the present embodiment will be described with reference to FIGS. 17 and 18. As has been described in relation to the first embodiment, the first and second detection units 10 and 20 detect a rotating magnetic field MF in the first and second positions P1 and P2, respectively. In the present embodiment, the first and second positions P1 and P2 are different from each other so that the direction DM of the rotating magnetic field MF in the first position P1 and that in the second position P2 are different from each other.

Figure 18:
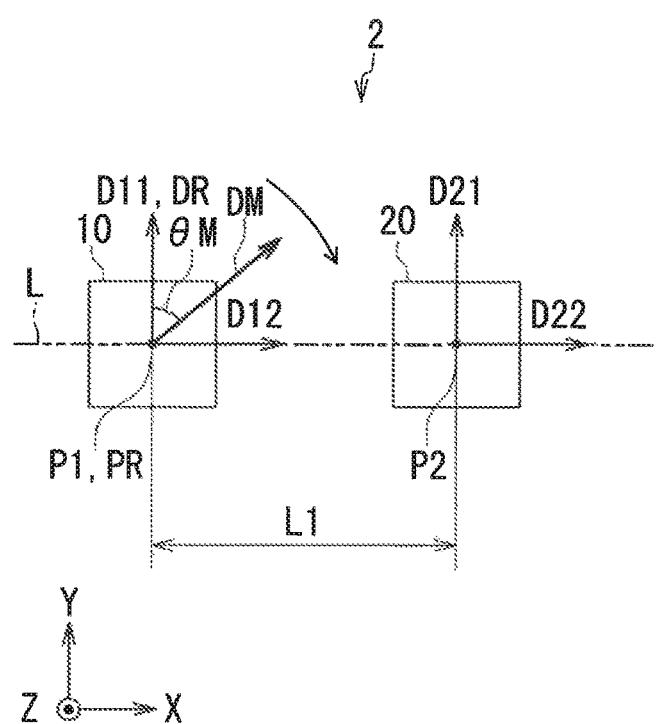
FIG. 18 is an explanatory diagram illustrating the definitions of directions and angles used in the fourth embodiment of the invention.

As shown in FIG. 18, the first and second positions P1 and P2 are on an imaginary straight line L parallel to the direction DL (the −X direction) and different from each other. The second position P2 is at a distance of L1 in the X direction from the first position P1. The specific value of the distance L1 will be described later.

The reference plane in the present embodiment is perpendicular to the Z direction. In the present embodiment, the first position P1 is the reference position PR, and the Y direction is the reference direction DR. Assume that the direction DM of the rotating magnetic field MF rotates clockwise in FIG. 18. The angle that the direction DM of the rotating magnetic field MF in the reference position PR forms with respect to the reference direction DR, i.e., the rotating field angle θM, will be expressed in positive values when seen clockwise from the reference direction DR, and in negative values when seen counterclockwise from the reference direction DR.

A first direction D11, a second direction D21, a third direction D12 and a fourth direction D22 will be defined as shown in FIG. 18. All the first to fourth directions D11, D21, D12 and D22 are parallel to the reference plane. In the present embodiment, both of the first and second directions D11 and D21 are the Y direction.

The third and fourth directions D12 and D22 are directions that are rotated by a predetermined angle from the first and second directions D11 and D21, respectively. In the present embodiment, the third and fourth directions D12 and D22 are directions that are rotated clockwise by 90° from the first and second directions D11 and D21, respectively. In other words, both of the third and fourth directions D12 and D22 are the X direction.

The first and second positions P1 and P2 are located in the first and second detection units 10 and 20, respectively. The first and second detection units 10 and 20 are arranged in such a positional relationship that the first and second positions P1 and P2 are different from each other as described above.

The relationships between the magnetization directions of the magnetization pinned layers in the first and second detection units 10 and 20 and the first to fourth directions D11, D21, D12 and D22 are the same as those in the first embodiment.

The first and second detection units 10 and 20 may be integrated into a single component. Alternatively, the first and second detection units 10 and 20 may be constructed of two discrete components. The two discrete components may have the same mechanical structure and be configured so that the magnetizations of the plurality of magnetization pinned layers are in the same relative direction with respect to the mechanical structure.

The first and second detection units 10 and 20 are arranged in a positional relationship that establishes the first and second phase relationships described in relation to the first embodiment. Now, a description will be given of a first example and a second example of the present embodiment.

The first example will now be described first. The first and second phase relationships according to the first example of the present embodiment are the same as those according to the first example of the first embodiment. In the first example, the first and second detection units 10 and 20 are arranged to establish the first and second phase relationships according to the first example. To be more specific, the first and second positions P1 and P2 are defined to make the distance L1 of FIG. 18 have a magnitude equivalent to an electrical angle of 180°/n.

In the magnetic field generation unit 8, the distance between the centers of two first portions 8A adjacent to each other with one second portion 8B in between is equal to the distance between the centers of two second portions 8B adjacent to each other with one first portion 8A in between. As shown in FIG. 17, the distance between the centers of two first portions 8A adjacent to each other with one second portion 8B in between will be referred to as one pitch and denoted by the symbol Lp. One period of the first to fourth detection signals S1 to S4, i.e., an electrical angle of 360°, is equivalent to one pitch. Thus, the magnitude equivalent to an electrical angle of 180°/n is Lp/(2n). In the first example, the first and second positions P1 and P2 are defined to make the distance L1 be Lp/(2n). In the present embodiment, n is 5, in particular. Thus, in the first example the first and second positions P1 and P2 are defined to make the distance L1 be Lp/10.

According to the first example, regardless of whether the first cause or the second cause distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are respectively expressible by Eqs. (3) and (4) of the first embodiment.

Next, the second example will be described. The first and second phase relationships according to the second example of the present embodiment are the same as those according to the second example of the first embodiment. In the second example, the first and second detection units 10 and 20 are arranged to establish the first and second phase relationships according to the second example. To be more specific, the first and second positions P1 and P2 are defined to make the distance L1 of FIG. 18 have a magnitude equivalent to an electrical angle of 360°/n.

The magnitude equivalent to an electrical angle of 360°/n is Lp/n. In the second example, the first and second positions P1 and P2 are defined to make the distance L1 be Lp/n. In the present embodiment, n is 5, in particular. Thus, in the second example the first and second positions P1 and P2 are defined to make the distance L1 be Lp/5.

According to the second example, regardless of whether the first cause or the second cause distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are respectively expressible by Eqs. (5) and (6) of the first embodiment.

Like the first embodiment, the present embodiment enables reduction of the first angular error component resulting from the first error component when the causes of distortion of the waveform of each of the first to fourth detection signals S1 to S4 include at least one of the first cause and the second cause.

The second angular error component resulting from the second error component can be reduced by the correction processing performed by the angle computing unit 54 (see FIG. 5). The details of the correction processing may be the same as those in the first embodiment. When the cause of distortion of the first to fourth detection signals S1 to S4 is the same as that in the second embodiment, the details of the correction processing may be the same as those in the second embodiment.

The other configuration, function and effects of the present embodiment are the same as those of the first or second embodiment.

Fifth Embodiment

Figure 19:
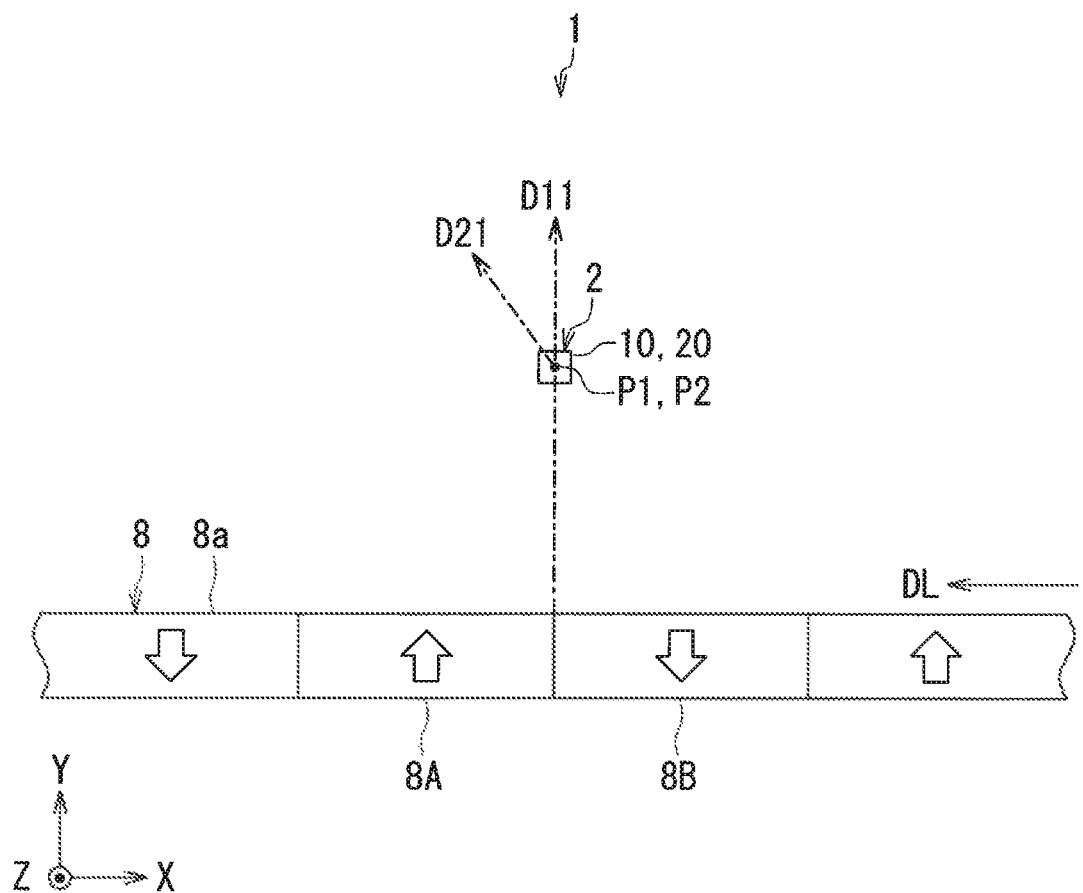
FIG. 19 is an explanatory diagram illustrating the general configuration of an angle sensor system according to a fifth embodiment of the invention.

Reference is now made to FIG. 19 to describe the general configuration of an angle sensor system according to a fifth embodiment of the present invention. The angle sensor system 1 according to the fifth embodiment differs from that according to the fourth embodiment in the following ways. In the fifth embodiment, the first and second positions P1 and P2 coincide with each other in a predetermined direction DL so that the direction DM of the rotating magnetic field MF in the first portion P1 and that in the second position P2 are the same.

In the present embodiment, the first and second detection units 10 and 20 are arranged in such a positional relationship that the first and second directions D11 and D21 are different from each other while the direction DM of the rotating magnetic field in the position where the first detection unit 10 is located and that in the position where the second detection unit 20 is located are the same, as in the third embodiment. The definitions of the first and second directions D11 and D21 are as illustrated in FIG. 16 described in relation to the third embodiment. The specific details of the positional relationship between the first and second detection units 10 and 20 are the same as those in the third embodiment.

The present embodiment enables reduction of the angular error resulting from the first error component when the causes of distortion of the waveform of each of the first to fourth detection signals S1 to S4 include the second cause.

The other configuration, function and effects of the present embodiment are the same as those of the third or fourth embodiment.

Sixth Embodiment

Figure 20:
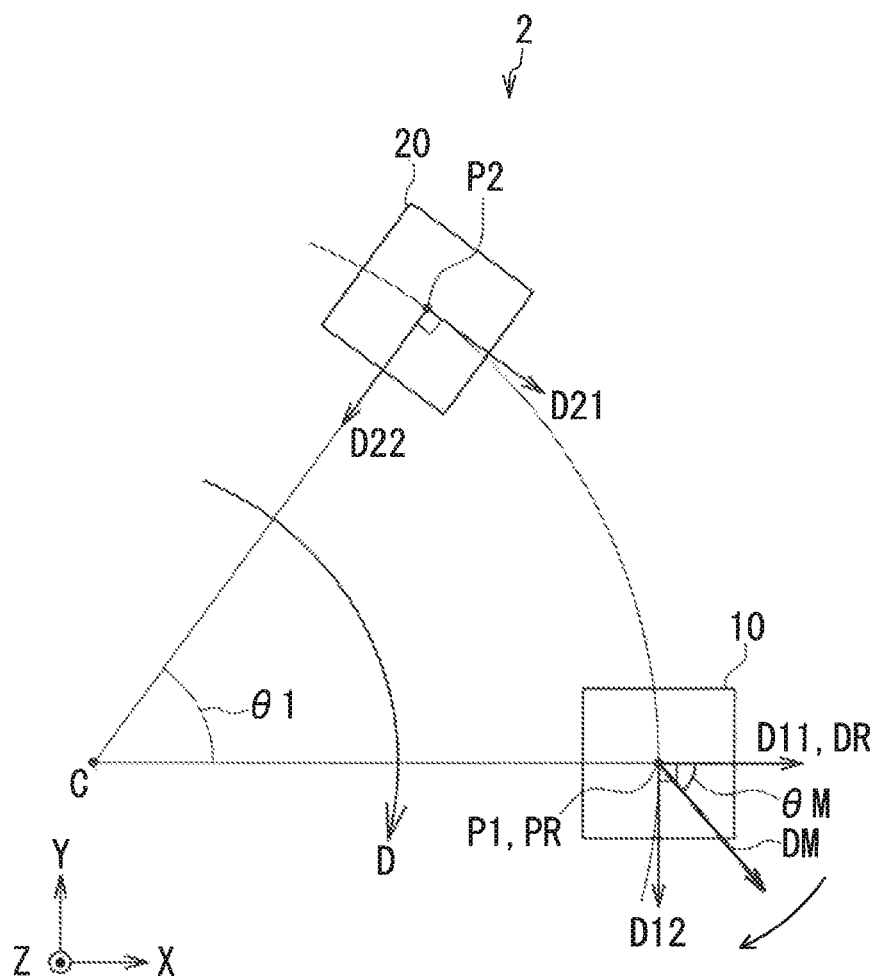
FIG. 20 is an explanatory diagram illustrating the definitions of directions and angles used in a sixth embodiment of the invention.

Reference is now made to FIG. 20 to describe an angle sensor system according to a sixth embodiment of the present invention. FIG. 20 is an explanatory diagram illustrating the definitions of directions and angles used in the sixth embodiment. The angle sensor system 1 according to the sixth embodiment differs from that according to the first embodiment in the following ways. The second direction D21 of the sixth embodiment is a direction that is rotated clockwise by 90° from the second direction D21 of the first embodiment. The fourth direction D22 of the sixth embodiment is a direction that is rotated clockwise by 90° from the fourth direction D22 of the first embodiment.

The relationships between the magnetization directions of the magnetization pinned layers in the first and second detection units 10 and 20 and the first to fourth directions D11, D21, D12 and D22 are the same as those in the first embodiment. The second detection unit 20 of the present embodiment and the second detection unit 20 of the first embodiment may have the same mechanical structure and be configured so that the magnetizations of the plurality of magnetization pinned layers are in the same relative direction with respect to the mechanical structure. In such a case, the second detection unit 20 of the present embodiment is placed in an orientation rotated clockwise by 90° with respect to the second detection unit 20 of the first embodiment.

Now, a description will be given of a first example and a second example of the present embodiment. The first example will be described first. The first and second phase relationships according to the first example of the present embodiment are the same as those according to the first example of the first embodiment. In the first example, the first and second detection units 10 and 20 are arranged to establish the first and second phase relationships according to the first example. To be more specific, the first and second positions P1 and P2 are defined to make the angle θ1 of FIG. 20 have a magnitude equivalent to an electrical angle of (90°−180°/n).

In the present embodiment, n is 5. Therefore, (90°−180°/n) is 54°. In the first example, the first and second detection units 10 and 20 are thus arranged by defining the first and second positions P1 and P2 to make the angle θ1 be 54°.

According to the first example, when it is the second cause that distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are expressible by the following Eqs. (44) and (45), respectively.

$$S3 = \cos\{\theta + (90° - 180°/n) - 90°\} \quad (44)$$
$$+ a_1 \cdot \cos[n\{\theta + (90° - 180°/n) - 90°\}]$$
$$+ b_1 \cdot \cos[m\{\theta + (90° - 180°/n) - 90°\} + g_1]$$
$$= \cos(\theta - 180°/n)$$
$$+ a_1 \cdot \cos(n\theta - 180°)$$
$$+ b_1 \cdot \cos\{m(\theta - 180°/n) + g_1\}$$
$$= \cos(\theta - 180°/n)$$
$$+ a_1 \cdot \cos(n\theta)$$
$$+ b_1 \cdot \cos\{m(\theta - 180°/n) + g_1\}$$

$$S4 = \sin\{\theta + (90° - 180°/n) - 90°\} \quad (45)$$
$$+ a_2 \cdot \sin[n\{\theta + (90° - 180°/n) - 90°\}]$$
$$+ b_2 \cdot \sin[m\{\theta + (90° - 180°/n) - 90°\} + g_2]$$
$$= \sin(\theta - 180°/n)$$
$$+ a_2 \cdot \sin(n\theta - 180°)$$
$$+ b_2 \cdot \sin\{m(\theta - 180°/n) + g_2\}$$
$$= \sin(\theta - 180°/n)$$
$$+ a_2 \cdot \sin(n\theta)$$
$$+ b_2 \cdot \sin\{m(\theta - 180°/n) + g_2\}$$

$$S3 = \cos\{\theta + (90° - 360°/n) - 90°\} \quad (46)$$
$$+ a_1 \cdot \cos[n\{\theta + (90° - 360°/n) - 90°\}]$$
$$+ b_1 \cdot \cos[m\{\theta + (90° - 360°/n) - 90°\} + g_1]$$
$$= \cos(\theta - 360°/n)$$
$$+ a_1 \cdot \cos(n\theta - 360°)$$
$$+ b_1 \cdot \cos\{m(\theta - 360°/n) + g_1\}$$
$$= \cos(\theta - 360°/n)$$
$$+ a_1 \cdot \cos(n\theta)$$
$$+ b_1 \cdot \cos\{m(\theta - 360°/n) + g_1\}$$

$$S4 = \sin\{\theta + (90° - 360°/n) - 90°\} \quad (47)$$
$$+ a_2 \cdot \sin[n\{\theta + (90° - 360°/n) - 90°\}]$$
$$+ b_2 \cdot \sin[m\{\theta + (90° - 360°/n) - 90°\} + g_2]$$
$$= \sin(\theta - 360°/n)$$
$$+ a_2 \cdot \sin(n\theta - 360°)$$
$$+ b_2 \cdot \sin\{m(\theta - 360°/n) + g_2\}$$
$$= \sin(\theta - 360°/n)$$
$$+ a_2 \cdot \sin(n\theta)$$
$$+ b_2 \cdot \sin\{m(\theta - 360°/n) + g_2\}$$

As is understood from Eqs. (1) and (44), performing the first operation of the first example, that is, the operation to obtain the sum of the first and third detection signals S1 and S3, allows the first error component "$a_1 \cdot \cos(n\theta)$" in Eq. (1) and the first error component "$-a_1 \cdot \cos(n\theta)$" in Eq. (44) to cancel each other out to thereby yield the first signal Sa that is lower in the first error component than the first and third detection signals S1 and S3.

As is understood from Eqs. (2) and (45), performing the second operation of the first example, that is, the operation to obtain the sum of the second and fourth detection signals S2 and S4, allows the first error component "$a_2 \cdot \sin(n\theta)$" in Eq. (2) and the first error component "$-a_2 \cdot \sin(n\theta)$" in Eq. (45) to cancel each other out to thereby yield the second signal Sb that is lower in the first error component than the second and fourth detection signals S2 and S4.

Next, the second example will be described. The first and second phase relationships according to the second example of the present embodiment are the same as those according to the second example of the first embodiment. In the second example, the first and second detection units 10 and 20 are arranged to establish the first and second phase relationships according to the second example. To be more specific, the first and second positions P1 and P2 are defined to make the angle θ1 of FIG. 20 have a magnitude equivalent to an electrical angle of (90°-360°/n).

In the present embodiment, n is 5. Therefore, (90°-360°/n) is 18°. In the second example, the first and second detection units 10 and 20 are thus arranged by defining the first and second positions P1 and P2 to make the angle θ1 be 18°.

According to the second example, when it is the second cause that distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are expressible by the following Eqs. (46) and (47), respectively.

As is understood from Eqs. (1) and (46), performing the second operation of the second example, that is, the operation to obtain the difference between the first and third detection signals S1 and S3, allows the first error component "$a_1 \cdot \cos(n\theta)$" in Eq. (1) and the first error component "$a_1 \cdot \cos(n\theta)$" in Eq. (46) to cancel each other out to thereby yield the first signal Sa that is lower in the first error component than the first and third detection signals S1 and S3.

As is understood from Eqs. (2) and (47), performing the second operation of the second example, that is, the operation to obtain the difference between the second and fourth detection signals S2 and S4, allows the first error component "$a_2 \cdot \sin(n\theta)$" in Eq. (2) and the first error component "$a_2 \cdot \sin(n\theta)$" in Eq. (47) to cancel each other out to thereby yield the second signal Sb that is lower in the first error component than the second and fourth detection signals S2 and S4.

Now, a brief description will be given of a method for generating the first and second signals Sa and Sb and a method for calculating the detected angle value θs in the present embodiment. The method for generating the first and second signals Sa and Sb and the method for calculating the detected angle value θs in the present embodiment are basically the same as those in the first embodiment. In the present embodiment, however, the values of $\alpha_1$ and $\alpha_2$ used in these methods are different from those in the first embodiment. In the first example of the present embodiment, $\alpha_1 = -180°/n$. In the second example of the present embodiment, $\alpha_2 = -360°/n$.

The present embodiment enables reduction of the angular error resulting from the first error component when the causes of distortion of the waveform of each of the first to fourth detection signals S1 to S4 include the second cause.

The other configuration, function and effects of the present embodiment are the same as those of the first embodiment.

Seventh Embodiment

Figure 21:
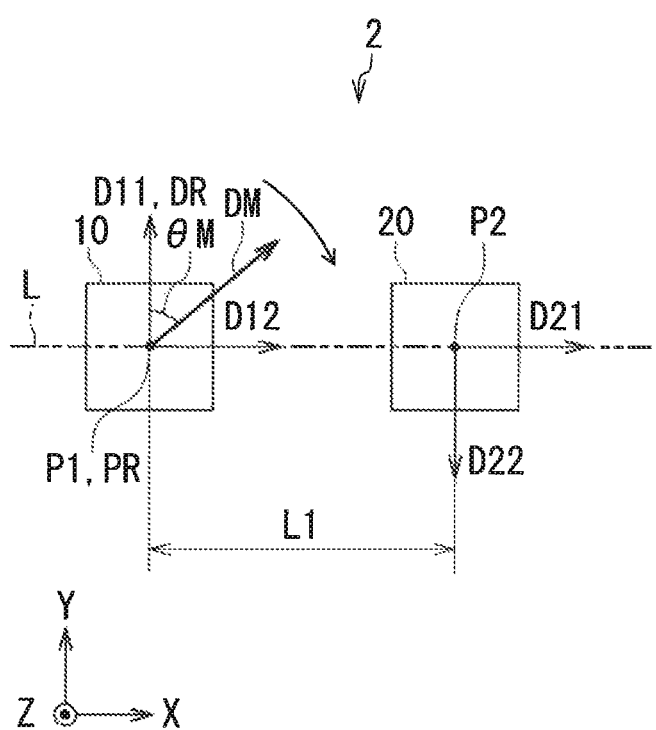
FIG. 21 is an explanatory diagram illustrating the definitions of directions and angles used in a seventh embodiment of the invention.

Reference is now made to FIG. 21 to describe an angle sensor system according to a seventh embodiment of the present invention. FIG. 21 is an explanatory diagram illustrating the definitions of directions and angles used in the seventh embodiment.

The angle sensor system 1 according to the seventh embodiment differs from that according to the fourth embodiment in the following ways. The second direction D21 of the seventh embodiment is a direction that is rotated clockwise by 90° from the second direction D21 of the fourth embodiment. The fourth direction D22 of the seventh embodiment is a direction that is rotated clockwise by 90° from the fourth direction D22 of the fourth embodiment.

The relationships between the magnetization directions of the magnetization pinned layers in the first and second detection units 10 and 20 and the first to fourth directions D11, D21, D12 and D22 are the same as those in the fourth embodiment. The second detection unit 20 of the present embodiment and the second detection unit 20 of the fourth embodiment may have the same mechanical structure and be configured so that the magnetizations of the plurality of magnetization pinned layers are in the same relative direction with respect to the mechanical structure. In such a case, the second detection unit 20 of the present embodiment is placed in an orientation rotated clockwise by 90° with respect to the second detection unit 20 of the fourth embodiment.

Now, a description will be given of a first example and a second example of the present embodiment. The first example will be described first. The first and second phase relationships according to the first example of the present embodiment are the same as those according to the first example of the fourth embodiment. In the first example, the first and second detection units 10 and 20 are arranged to establish the first and second phase relationships according to the first example. To be more specific, the first and second positions P1 and P2 are defined to make the distance L1 of FIG. 21 have a magnitude equivalent to an electrical angle of (90°–180°/n).

The magnitude equivalent to an electrical angle of (90°–180°/n) is Lp{¼–1/(2n)}. As has been described in relation to the fourth embodiment, Lp represents the distance between the centers of two first portions 8A adjacent to each other with one second portion 8B in between in the magnetic field generation unit 8 (see FIG. 17). In the first example, the first and second positions P1 and P2 are defined to make the distance L1 be Lp{¼–1/(2n)}. In the present embodiment, n is 5, in particular. Thus, in the first example the first and second positions P1 and P2 are defined to make the distance L1 be 3Lp/20.

According to the first example, when it is the second cause that distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are respectively expressible by Eqs. (44) and (45) of the sixth embodiment.

Next, the second example will be described. The first and second phase relationships according to the second example of the present embodiment are the same as those according to the second example of the fourth embodiment. In the second example, the first and second detection units 10 and 20 are arranged to establish the first and second phase relationships according to the second example. To be more specific, the first and second positions P1 and P2 are defined to make the distance L1 of FIG. 21 have a magnitude equivalent to an electrical angle of (90°–360°/n).

The magnitude equivalent to an electrical angle of (90°–360°/n) is Lp(¼–1/n). In the second example, the first and second positions P1 and P2 are defined to make the distance L1 be Lp(¼–1/n). In the present embodiment, n is 5, in particular. Thus, in the second example the first and second positions P1 and P2 are defined to make the distance L1 be Lp/20.

According to the second example, when it is the second cause that distorts the waveform of each of the first to fourth detection signals S1 to S4, if the first and second detection signals S1 and S2 are respectively expressed by Eqs. (1) and (2) of the first embodiment, then the third and fourth detection signals S3 and S4 are respectively expressible by Eqs. (46) and (47) of the sixth embodiment.

The method for generating the first and second signals Sa and Sb and the method for calculating the detected angle value θs in the present embodiment are the same as those in the sixth embodiment.

The present embodiment enables reduction of the angular error resulting from the first error component when the causes of distortion of the waveform of each of the first to fourth detection signals S1 to S4 include the second cause.

The other configuration, function and effects of the present embodiment are the same as those of any of the first, fourth and sixth embodiments.

The present invention is not limited to the foregoing embodiments, and various modifications may be made thereto. For example, the angle computing unit 54 may perform processing different from the first or second correction processing.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. An angle sensor for generating a detected angle value, the detected angle value having a correspondence with an angle that a direction of a rotating magnetic field in a reference position forms with respect to a reference direction, the angle sensor comprising:
   a first detection circuit and a second detection circuit configured to each detect the rotating magnetic field and each generate two detection signals; and
   a processor configured to calculate the detected angle value based on the two detection signals generated by the first detection circuit and the two detection signals generated by the second detection circuit, wherein
   the first detection circuit generates, as the two detection signals, a first detection signal and a second detection signal, each of the first and second detection signals corresponding to a first angle that the direction of the rotating magnetic field in a first position forms with respect to a first direction;
   the second detection circuit generates, as the two detection signals, a third detection signal and a fourth detection signal, each of the third and fourth detection signals corresponding to a second angle that the direction of the rotating magnetic field in a second position forms with respect to a second direction;
   the first and second detection circuit are arranged in a predetermined positional relationship such that a high-order harmonic contained in the first detection signal and a high-order harmonic contained in the third detection signal cancel each other out, and that a high-order harmonic contained in the second detection signal and a high-order harmonic contained in the fourth detection signal cancel each other out; and
   the processor performs correction processing by which an error occurring in the detected angle value due to a lower-order harmonic contained in each of the first to fourth detection signals is reduced relative to a case where the correction processing is not performed.

2. The angle sensor according to claim 1, wherein the positional relationship between the first detection circuit and the second detection circuit is such that the first position and the second position are different from each other so that the direction of the rotating magnetic field in the first position and the direction of the rotating magnetic field in the second position are different from each other.

3. The angle sensor according to claim 1, wherein the positional relationship between the first detection circuit and the second detection circuit is such that the first direction and the second direction are different from each other while the direction of the rotating magnetic field in the first position and the direction of the rotating magnetic field in the second position are same.

4. The angle sensor according to claim 1, wherein
each of the first to fourth detection signals contains an ideal component that varies periodically so as to trace an ideal sinusoidal curve, when the direction of the rotating magnetic field varies with a predetermined period, and
the phase difference between the ideal components of the first and second detection signals and the phase difference between the ideal components of the third and fourth detection signals are both 90°.

5. The angle sensor according to claim 1, wherein the first and second detection circuits include first to fourth magnetic detection elements, which generate the first to fourth detection signals, respectively.

6. The angle sensor according to claim 5, wherein at least one of the first to fourth magnetic detection elements includes at least one magnetoresistance element.

7. The angle sensor according to claim 6, wherein the at least one magnetoresistance element includes a magnetization pinned layer whose magnetization direction is pinned, a free layer whose magnetization direction varies depending on the direction of the rotating magnetic field, and a nonmagnetic layer located between the magnetization pinned layer and the free layer.

8. The angle sensor according to claim 1, wherein
each of the first to fourth detection signals contains an ideal component that varies periodically so as to trace an ideal sinusoidal curve, when the direction of the rotating magnetic field varies with a predetermined period,
the high-order harmonic is a fifth harmonic of the ideal component, and
the lower-order harmonic is a third harmonic of the ideal component.

9. The angle sensor according to claim 1, wherein the processor is a computer or an application-specific integrated circuit.

10. An angle sensor system comprising:
the angle sensor according to claim 1; and
a magnet configured to generate the rotating magnetic field.

11. The angle sensor system according to claim 10, wherein the positional relationship between the first detection circuit and the second detection circuit is such that the first position and the second position are different from each other so that the direction of the rotating magnetic field in the first position and the direction of the rotating magnetic field in the second position are different from each other.

12. The angle sensor system according to claim 11, wherein
the magnet is configured to vary its relative position with respect to the first and second detection circuits in a predetermined direction, and
the first position and the second position are different from each other in the predetermined direction.

13. The angle sensor system according to claim 12, wherein
the magnet is configured to rotate about a central axis,
the predetermined direction is the direction of rotation of the magnet, and
the first position and the second position are in an imaginary plane perpendicular to the central axis and located a same distance from the central axis.

14. The angle sensor system according to claim 12, wherein
the first position and the second position are on an imaginary straight line and different from each other, and
the predetermined direction is parallel to the imaginary straight line.

15. The angle sensor system according to claim 10, wherein the positional relationship between the first detection circuit and the second detection circuit is such that the first direction and the second direction are different from each other while the direction of the rotating magnetic field in the first position and the direction of the rotating magnetic field in the second position are the same.

16. An angle sensor for generating a detected angle value, the detected angle value having a correspondence with an angle that a direction of a rotating magnetic field in a reference position forms with respect to a reference direction, the angle sensor comprising:
a first detection circuit configured to generate a first detection signal and a second detection signal, each of the first and second detection signals corresponding to a first angle that the direction of the rotating magnetic field in a first position forms with respect to a first direction;
a second detection circuit configured to generate a third detection signal and a fourth detection signal, each of the third and fourth detection signals corresponding to a second angle that the direction of the rotating magnetic field in a second position forms with respect to a second direction, the second detection circuit being arranged in a positional relationship, relative to the first detection circuit, that establishes a first phase relationship between the first and third detection signals, in which an n-th harmonic contained in the first detection signal and an n-th harmonic contained in the third detection signal cancel each other out, and a second phase relationship between the second and fourth detection signals, in which an n-th harmonic contained in the second detection signal and an n-th harmonic contained in the fourth detection signal cancel each other out; and
a processor configured to calculate the detected angle value on the basis of the first to fourth detection signals, and to perform correction processing by which an error occurring in the detected angle value due to an m-th harmonic which is a lower-order harmonic than the n-th harmonic contained in each of the first to fourth detection signals is reduced relative to the case where the correction processing is not performed.

17. An angle sensor for generating a detected angle value, the detected angle value having a correspondence with an angle that a direction of a rotating magnetic field in a reference position forms with respect to a reference direction, the angle sensor comprising:
- a first detection circuit configured to generate a first detection signal and a second detection signal, each of the first and second detection signals corresponding to a first angle that the direction of the rotating magnetic field in a first position forms with respect to a first direction;
- a second detection circuit configured to generate a third detection signal and a fourth detection signal, each of the third and fourth detection signals corresponding to a second angle that the direction of the rotating magnetic field in a second position forms with respect to a second direction; and
- a processor, wherein
- when the direction of the rotating magnetic field varies with a predetermined period, each of the first to fourth detection signals contains an ideal component, a first error component, and a second error component,
- the ideal component varies periodically so as to trace an ideal sinusoidal curve,
- the first error component corresponds to an n-th harmonic of the ideal component,
- the second error component corresponds to an m-th harmonic of the ideal component,
- n and m are numerical values different from each other,
- the ideal components of the first and second detection signals differ in phase from each other,
- the ideal components of the third and fourth detection signals differ in phase from each other,
- the first detection circuit and the second detection circuit are arranged in a positional relationship that establishes a first phase relationship between the ideal components of the first and third detection signals, and a second phase relationship between the ideal components of the second and fourth detection signals,
- the first phase relationship is such that performing a first operation to obtain a sum of or difference between the first and third detection signals yields a first signal that is lower in the first error component than the first and third detection signals,
- the second phase relationship is such that performing a second operation to obtain a sum of or difference between the second and fourth detection signals yields a second signal that is lower in the first error component than the second and fourth detection signals, and
- the processor is configured to:
  - generate the first signal by performing the first operation;
  - generate the second signal by performing the second operation;
  - calculate the detected angle value based on the first signal and the second signal; and
  - perform correction processing by which an error occurring in the detected angle value due to the second error component is reduced relative to a case where the correction processing is not performed.

18. The angle sensor according to claim 17, wherein the processor includes:
- a first computing circuit for performing the first operation;
- a second computing circuit for performing the second operation; and
- an angle computing circuit for performing an operation for calculating the detected angle value and the correction processing.

* * * * *